(12) United States Patent
Yuh et al.

(10) Patent No.: US 12,389,806 B2
(45) Date of Patent: Aug. 12, 2025

(54) MRAM CELL AND MRAM

(71) Applicant: Taiwan Semiconductor Manufacturing Company, Ltd., Hsinchu (TW)

(72) Inventors: Perng-Fei Yuh, Walnut Creek, CA (US); Yih Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/602,174

(22) Filed: Mar. 12, 2024

(65) Prior Publication Data
US 2024/0224813 A1  Jul. 4, 2024

Related U.S. Application Data

(60) Continuation of application No. 17/734,374, filed on May 2, 2022, now Pat. No. 11,963,463, which is a division of application No. 16/884,297, filed on May 27, 2020, now Pat. No. 11,322,680.

(51) Int. Cl.
| | |
|---|---|
| *H10N 50/80* | (2023.01) |
| *G11C 5/02* | (2006.01) |
| *G11C 11/16* | (2006.01) |
| *H10B 61/00* | (2023.01) |

(52) U.S. Cl.
CPC .............. *H10N 50/80* (2023.02); *G11C 5/025* (2013.01); *G11C 11/161* (2013.01); *H10B 61/00* (2023.02)

(58) Field of Classification Search
CPC ...... H10N 50/80; G11C 5/025; G11C 11/161; H10B 61/00
See application file for complete search history.

(56) References Cited

U.S. PATENT DOCUMENTS

| | | | |
|---|---|---|---|
| 2013/0258763 A1* | 10/2013 | Ranjan | G11C 11/1673 365/158 |
| 2014/0246742 A1 | 9/2014 | Lee | |
| 2019/0206472 A1 | 7/2019 | Bozdag | |
| 2019/0334080 A1 | 10/2019 | Ahmed | |
| 2020/0013456 A1* | 1/2020 | Tzoufras | H10N 50/80 |

\* cited by examiner

*Primary Examiner* — Shih Tsun A Chou
(74) *Attorney, Agent, or Firm* — McClure, Qualey & Rodack, LLP

(57) ABSTRACT

Magnetic random access memory (MRAM) cells are provided. MRAM cell includes a plurality of stacked magnetic tunnel junction (MTJ) devices coupled in serial and coupled between a bit line and a source line. The stacked MTJ devices have different sizes. Each of the stacked MTJ devices includes a free layer, a pinned layer and a barrier layer between the free layer and the pinned layer. The free layers of two adjacent stacked MTJ devices are in direct contact with each other.

20 Claims, 18 Drawing Sheets

| Access Current Iw | Initial | I1 (Ic2<Iw<Ic1) | I2 (Ic1<Iw) | I3 (-Ic1<Iw<-Ic2) | I4 (Iw<-Ic1) |
|---|---|---|---|---|---|
| MTJ1 | Rap1 | Rap1 | Rp1 | Rp1 | Rap1 |
| MTJ2 | Rap2 | Rp2 | Rp2 | Rap2 | Rap2 |
| state | aa (S41) | ap (S42) | pp (S43) | pa (S44) | aa (S41) |
| Serial-R | Rap1+Rap2 | Rap1+Rp2 | Rp1+Rp2 | Rp1+Rap2 | Rap1+Rap2 |

FIG. 6

MRAM CELL AND MRAM

CROSS REFERENCE TO RELATED APPLICATIONS

This Application is a Continuation of application Ser. No. 17/734,374, filed on May 2, 2022 now U.S. Pat. No. 11,963,463), which is a Divisional of application Ser. No. 16/884,297, filed on May 27, 2020 (now U.S. Pat. No. 11,322,680), the entirety of which is incorporated by reference herein.

BACKGROUND

An MRAM (magnetic random access memory) is a form of non-volatile memory capable of storing bits of digital information ("0" or "1"). In an MRAM, digital data is not stored as an electrical charge as it is in traditional RAM components, but rather the bit state ("0" or "1") is stored via resistive states (high resistance or low resistance) in magnetic storage elements which do not require constant electrical power to retain their state.

MRAM may be a cost-effective solution for long-term data retention and rapid on/off applications such as mobile devices and general consumer electronic systems. Compared with static random access memory (SRAM) and flash memory, MRAM can provide fast, low-power, nonvolatile storage.

BRIEF DESCRIPTION OF THE DRAWINGS

Aspects of the present disclosure are best understood from the following detailed description when read with the accompanying figures. It should be noted that, in accordance with the standard practice in the industry, various nodes are not drawn to scale. In fact, the dimensions of the various nodes may be arbitrarily increased or reduced for clarity of discussion.

FIG. 6 shows a table illustrating the relationship of the access current Iw and the equivalent impedance of stacked MTJ devices.

DETAILED DESCRIPTION

Figure 1A:
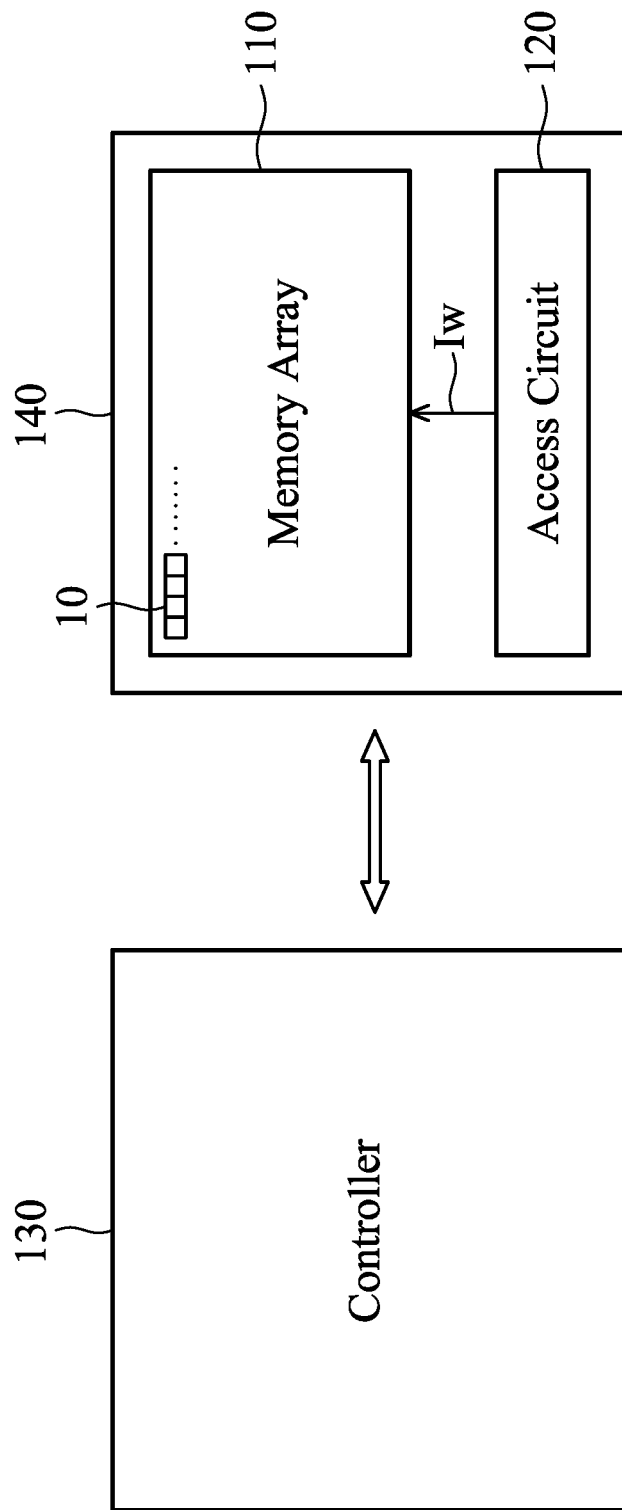
FIG. 1A shows an integrated circuit (IC), in accordance with some embodiments of the disclosure.

The following disclosure provides many different embodiments, or examples, for implementing different nodes of the subject matter provided. Specific examples of components and arrangements are described below to simplify the present disclosure. These are, of course, merely examples and are not intended to be limiting. In some embodiments, the formation of a first node over or on a second node in the description that follows may include embodiments in which the first and the second nodes are formed in direct contact, and may also include embodiments in which additional nodes may be formed between the first and the second nodes, such that the first and the second nodes may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A shows an integrated circuit (IC) 100A, in accordance with some embodiments of the disclosure. The IC 100A includes a magnetic random access memory (MRAM) 140, and a controller 130. The MRAM 140 includes a memory array 110 and an access circuit 120. The memory array 110 is formed by multiple MRAM cells 10 arranged in multiple rows and multiple columns. The MARM cells 10 of the memory array 110 are used to store data, and each memory cell 10 includes multiple magnetic tunnel junction (MTJ) devices capable of storing multiple-bit data. The access circuit 120 includes circuits for accessing the memory array 110, such as a row decoder, a column decoder, a sense circuit having multiple sense amplifiers, and a writing circuit having multiple writing drivers. According to the address information from the controlled 130, the access circuit 120 is capable of providing an access current Iw to perform a read operation to read data from the memory array 110 and/or perform a write operation to write (or program) data into the memory array 110.

Figure 1B:
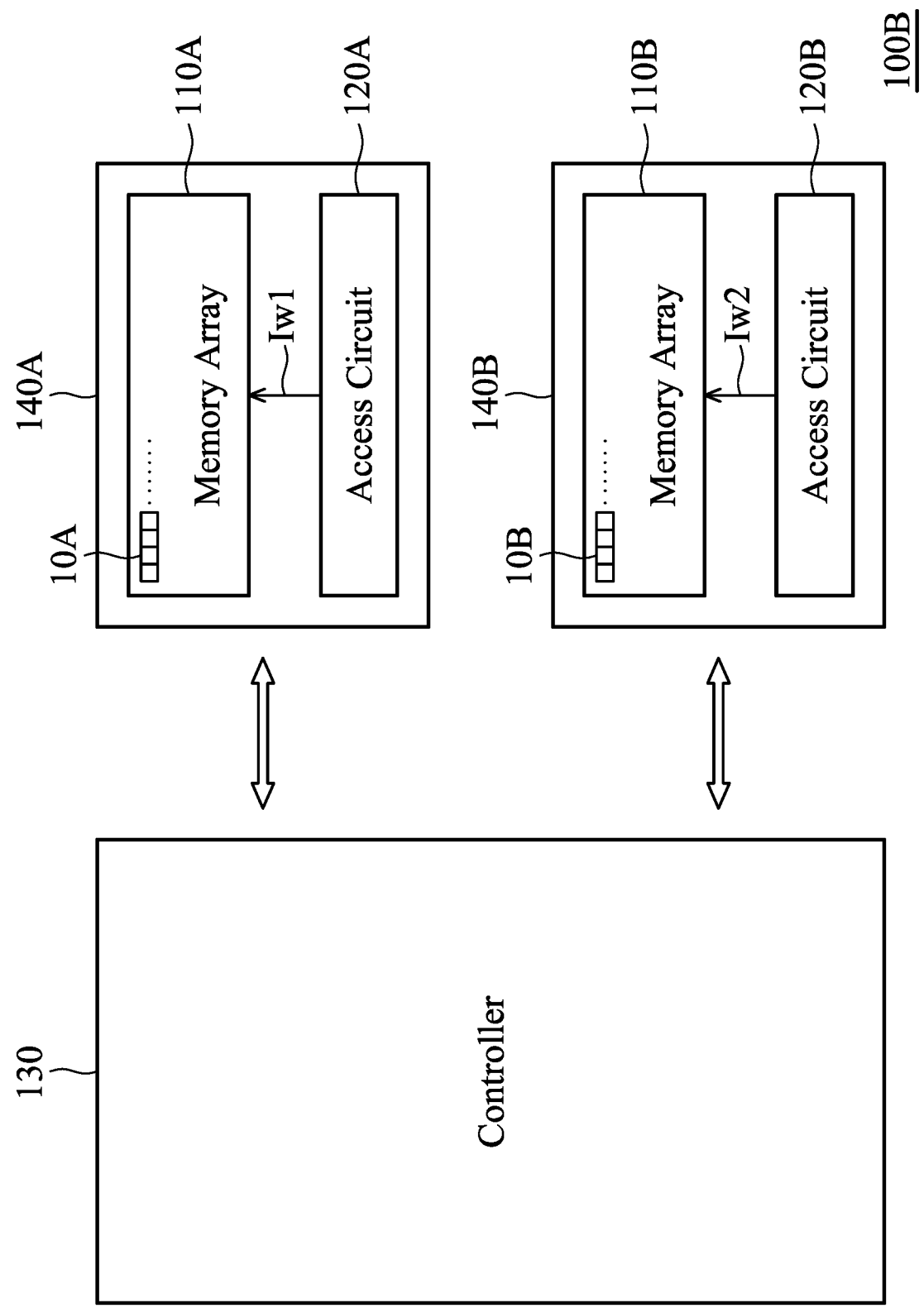
FIG. 1B shows an IC, in accordance with some embodiments of the disclosure.

FIG. 1B shows an IC 100B, in accordance with some embodiments of the disclosure. The IC 100B includes a first MRAM 140A, a second MRAM 140B and a controller 130. Compared with the IC 100A FIG. 1, the IC 100B includes multiple MRAMs.

The first MRAM 140A includes a memory array 110A and an access circuit 120A. The memory array 110A is formed by multiple MRAM cells 10A arranged in multiple rows and multiple columns. The MARM cells 10A of the memory array 110A are used to store data, and each memory cell 10A includes one or more MTJ device capable of storing at least one bit data. The access circuit 120A includes circuits for accessing the memory array 110A, such as a row decoder, a column decoder, a sense circuit having multiple sense amplifiers, and a writing circuit having multiple writing drivers. According to the address information from the controller 130, the access circuit 120A is capable of providing an access current Iw1 to perform a read operation to read data from the memory array 110A and/or perform a write operation to write (or program) data into the memory array 110A.

The second MRAM 140B includes a memory array 110B and an access circuit 120B. The memory array 110B is formed by multiple MRAM cells 10B arranged in multiple rows and multiple columns. The MARM cells 10B of the memory array 110B are used to store data, and each memory cell 10B includes multiple MTJ devices capable of storing multiple-bit data. The access circuit 120B includes circuits for accessing the memory array 110B, such as a row decoder, a column decoder, a sense circuit having multiple sense amplifiers, and a writing circuit having multiple writing drivers. According to the address information from the controller 130, the access circuit 120B is capable of providing an access current Iw2 to perform a read operation to read data from the memory array 110B and/or perform a write operation to write (or program) data into the memory array 110B.

It should be noted that the number of MTJ devices in each memory cell 10A of the first MRAM 140A is different from the number of MTJ devices in each memory cell 10B of the second MRAM 140B. In some embodiments, the number of MTJ devices in each memory cell 10A of the first MRAM 140A is less than the number of MTJ devices in each memory cell 10B of the second MRAM 140B. Thus, the bit number of data stored in the memory cell 10A is less than the bit number of data stored in the memory cell 10B.

Figure 2A:
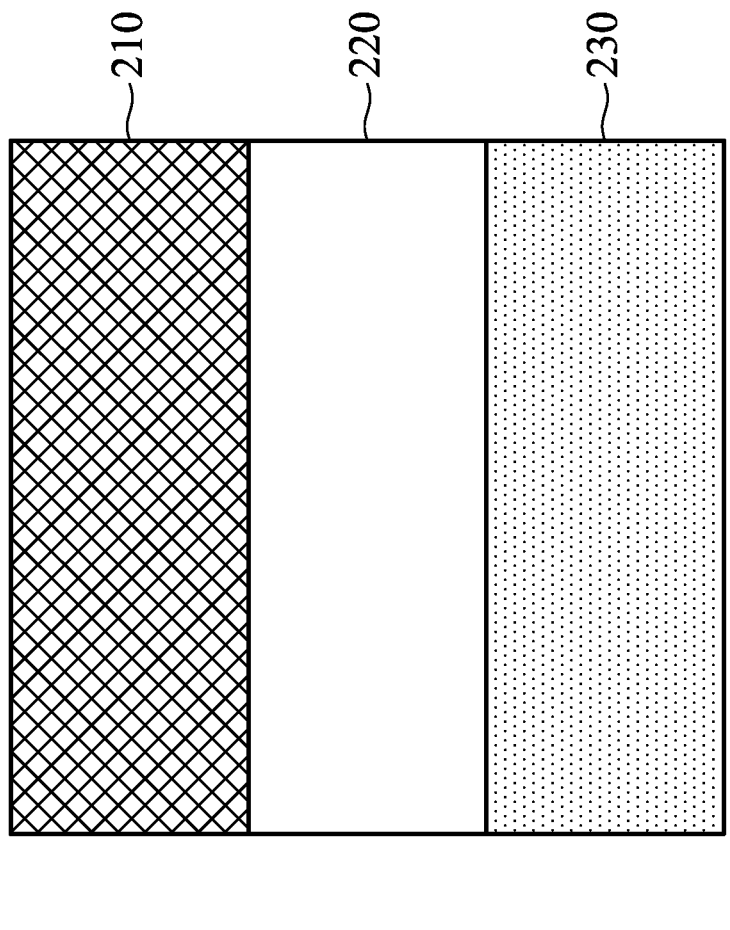
FIG. 2A shows an example schematic of an MTJ device, in accordance with some embodiments of the disclosure.

FIG. 2A shows an example schematic of an MTJ device 200, in accordance with some embodiments of the disclosure. The MTJ device 200 includes at least the following layers: a free layer 210, a barrier layer 220 which serves as a tunneling barrier, and a pinned layer 230. In each MTJ device 200, the pinned layer 230 has a fixed magnetization direction (or magnetic orientation). Furthermore, the free layer 210 has a magnetization direction that, with the application of a spin torque caused by a current through the MTJ device 200, can be switched between a first direction, which is parallel to the magnetization direction of the pinned layer 230 (i.e. a parallel magnetic state P_state), and a second direction opposite to the first direction. The second direction is anti-parallel to the magnetization direction of the pinned layer 230 (i.e. an anti-parallel magnetic state AP_state). In some embodiments, the free layer 210, the barrier layer 220 and the pinned layer 230 are formed in the back end of line (BEOL) process.

The barrier layer 220 is disposed between the pinned layer 230 and the free layer 210. The barrier layer 220 is composed of insulating material, for example aluminum oxide, magnesium oxide, or tantalum oxide. The barrier layer 220 is formed thin enough to allow the transfer (tunneling) of spin-aligned electrons when the magnetization directions of the free layer 210 and the pinned layer 230 are parallel. Conversely, when the magnetization directions of the free layer 210 and the pinned layer 230 are anti-parallel, the probability of electrons tunneling through the barrier layer 220 is reduced.

Figure 2B:
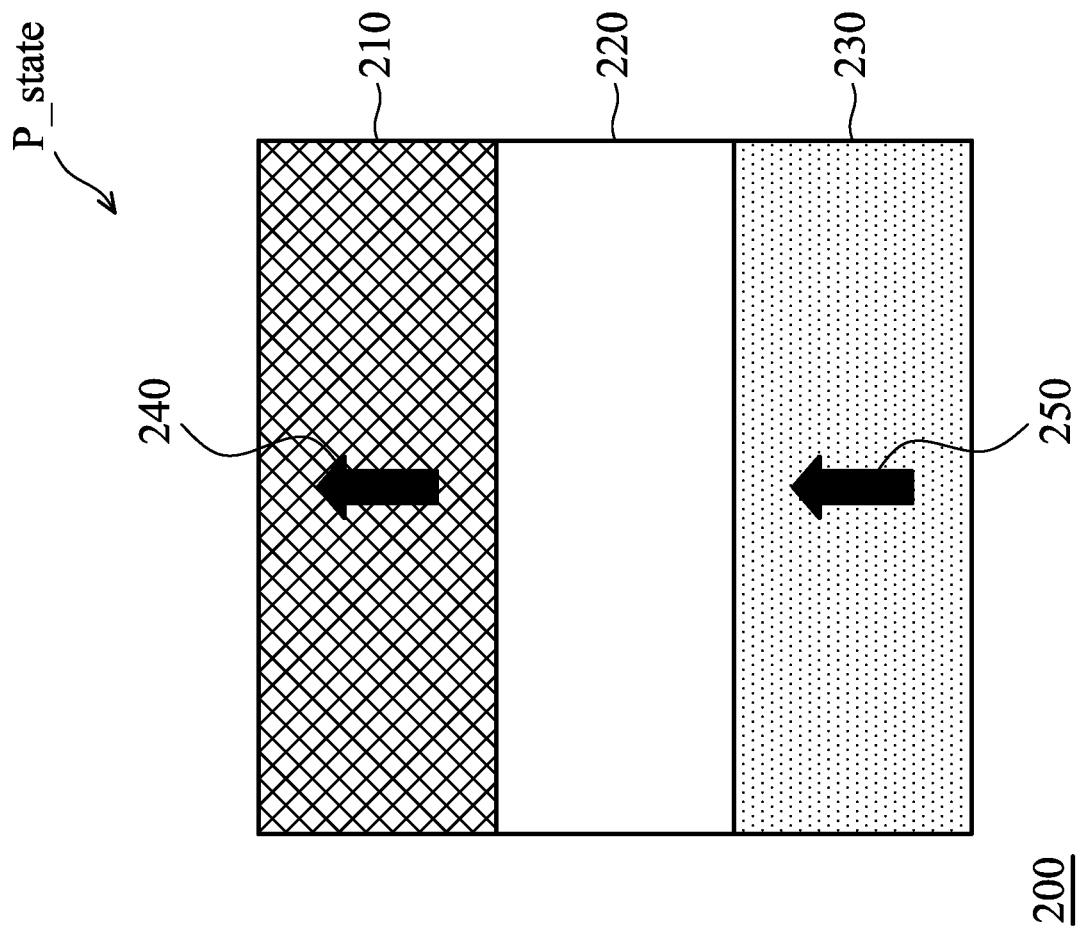
FIG. 2B shows an example of a parallel magnetic state P_state of the MTJ device of FIG. 2A.

FIG. 2B shows an example of a parallel magnetic state P_state of the MTJ device 200 of FIG. 2A. In FIG. 2B, the free layer 210 has a magnetization direction 240 from the pinned layer 230 to the free layer 210. Furthermore, the pinned layer 230 has a magnetization direction 250 from the pinned layer 230 to the free layer 210. Due to the magnetization direction 240 being parallel to the magnetization direction 250, the MTJ device 200 is in a parallel magnetic state P_state with a low resistance Rp. The resistance of the MTJ device 200 is decreased when the magnetization directions 240 and 250 become more parallel.

Figure 2C:
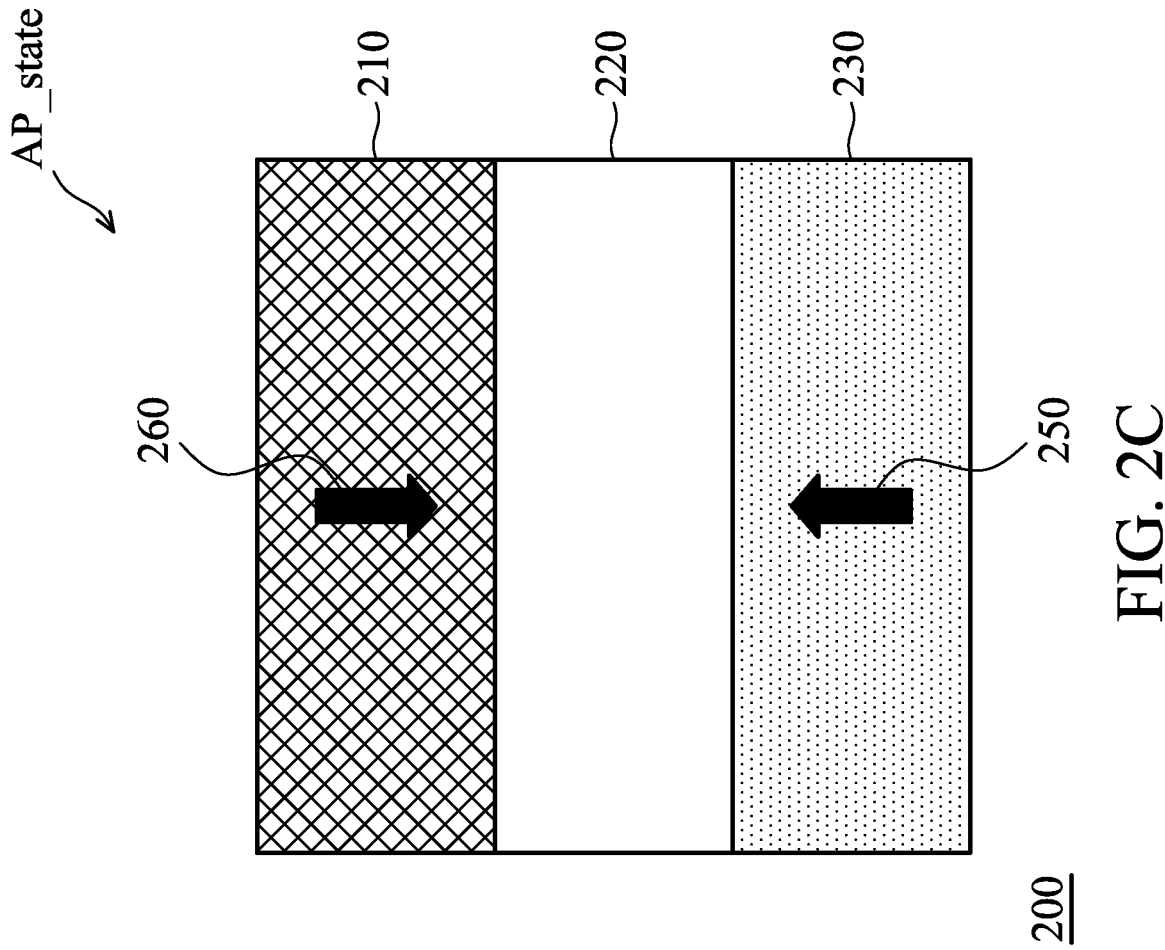
FIG. 2C shows an example of an anti-parallel magnetic state AP_state of the MTJ device of FIG. 2A.

FIG. 2C shows an example of an anti-parallel magnetic state AP_state of the MTJ device 200 of FIG. 2A. In FIG. 2C, the free layer 210 has a magnetization direction 260 from the free layer 210 to the pinned layer 230. Furthermore, the pinned layer 230 has a magnetization direction 250 from the pinned layer 230 to the free layer 210. Due to the magnetization direction 260 being anti-parallel to the magnetization direction 250, the MTJ device 200 is in an anti-parallel magnetic state AP_state with a high resistance Rap higher than the low resistance Rp, i.e., Rap>Rp. The resistance of the MTJ device 200 is increased when the magnetization directions 260 and 250 become more anti-parallel.

In such embodiments, the MTJ device 200 is a perpendicular-spin MTJ, and the spins of the free layer 210 and the pinned layer 230 are perpendicular to the plane of the layers themselves.

In some embodiments, the MTJ device 200 is an in-plane-spin MTJ, and the spins of the free layer 210 and the pinned layer 230 are in the same plane as the layers themselves.

In the MRAM, the resistance of the MTJ device 200 can be switched between the high resistance Rap and the low resistance Rp that respectively represent first and second logic levels. For example, the high resistance Rap of an anti-parallel magnetic state AP_state can represent a high logic level (i.e. "1"), and the low resistance Rp of a parallel magnetic state P_state can represent a low logic state (i.e. "0"). Thus, by controlling the magnetization directions of the free layer 210 and the pinned layer 230 of the MTJ device 200 with a writing current, a bit ("1" or "0") of data is stored in the MTJ device 200. Furthermore, the logic level of data stored in the MTJ device 200 can be read by passing a sense current through the MTJ device 200 and then sensing the resistance of the MTJ device 200. In some embodiments, the writing current and the sense current are provided by the access current (e.g., Iw of FIG. 1A and Iw1 and Iw2 of FIG. 1B).

Figure 3A:
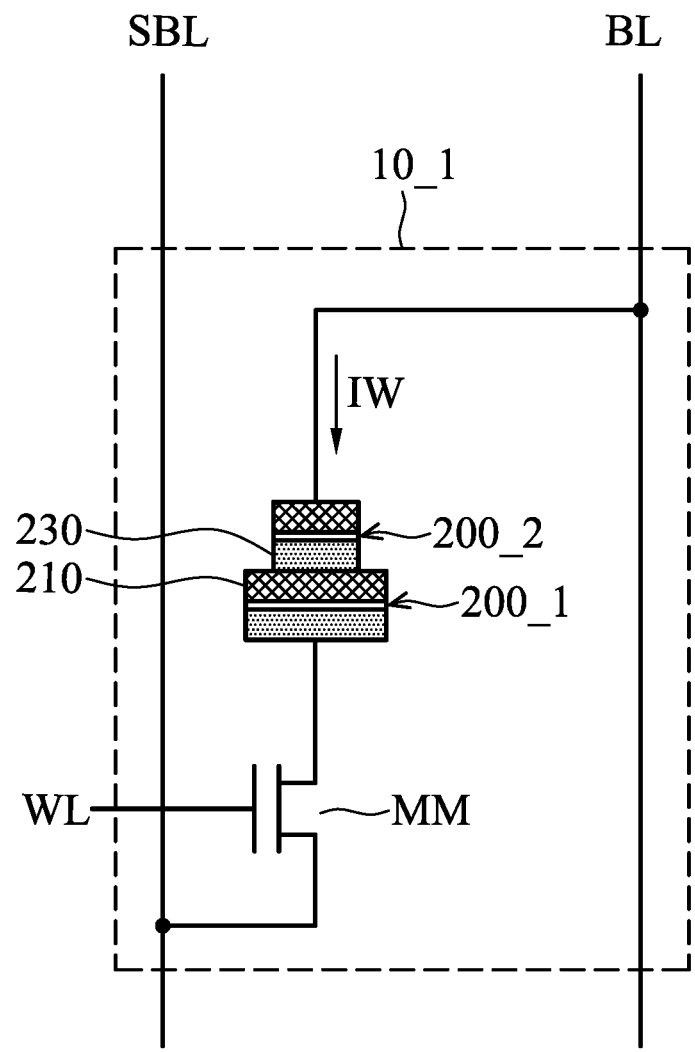
FIG. 3A shows an example schematic of an MRAM cell, in accordance with some embodiments of the disclosure.

FIG. 3A shows an example schematic of an MRAM cell 10_1, in accordance with some embodiments of the disclosure. The MRAM cell 10_1 includes a transistor MM and the MTJ devices 200_1 and 200_2 coupled in series. In some embodiments, the transistor MM is a N-type transistor. The transistor MM is coupled between a source line SBL and the MTJ device 200_1, and a gate of the transistor MM is coupled to a word line WL. The MTJ devices 200_1 and 200_2 are stacked between the transistor MM and a bit line BL. The MRAM cell 10_1 is capable of storing two-bit data DATA_1 based on the stacked MTJ devices 200_1 and 200_2. As described above, by applying the access current Iw to the stacked MTJ devices 200_1 and 200_2, the MTJ device 200_1 and/or 200_2 is switched from a parallel magnetic state P_state to an anti-parallel magnetic state AP_state or from the anti-parallel magnetic state AP_state to the parallel magnetic state P_state.

In the MRAM cell 10_1, the free layer 210 of the MTJ device 200_1 is in contact with the pinned layer 230 of the MTJ device 200_2. In some embodiments, a conducting layer (e.g., an electrode) is formed between the free layer 210 of the MTJ device 200_1 and the pinned layer 230 of the MTJ device 200_2. It should be noted that the MTJ devices 200_1 and 200_2 are different sizes.

In some embodiments, the thickness of the free layers 210 of the MTJ devices 200_1 and 200_2 are the same. Furthermore, the thickness of the barrier layer 220 of the MTJ devices 200_1 and 200_2 are the same, and the thickness of the pinned layer 230 of the MTJ devices 200_1 and 200_2 are the same. The difference between the MTJ devices 200_1 and 200_2 is that the area of the free layer 210, the barrier layer 220 and the pinned layer 230 of the MTJ device 200_1 is greater than that of the MTJ device 200_2. Thus, the equivalent impedances of the MTJ devices 200_1 and 200_2 are different.

In some embodiments, the thickness of the free layers 210 of the MTJ devices 200_1 and 200_2 are the same, and the thickness of the pinned layer 230 of the MTJ devices 200_1 and 200_2 are the same. Furthermore, the area of the free layer 210, the barrier layer 220 and the pinned layer 230 of the MTJ device 200_1 is the same as that of the MTJ device 200_2. The difference between the MTJ devices 200_1 and 200_2 is that the thickness of the barrier layer 220 of the MTJ devices 200_1 and 200_2 are different. Thus, the equivalent impedances of the MTJ devices 200_1 and 200_2 are different.

In some embodiments, the transistor MM is a planar transistor, e.g., CMOS transistor. The MTJ devices 200_1 and 200_2 are planar devices. The stacked MTJ devices 200_1 and 200_2 formed a conventional planar structure that is coupled to the source/drain region of the transistor MM through various interconnection layers.

In some embodiments, the transistor MM is a fin field-effect transistor (FINFET). The stacked MTJ devices 200_1 and 200_2 form a conventional planar structure that is coupled to the source/drain region of the transistor MM through various interconnection layers.

In some embodiments, the transistor MM is a FINFET. The stacked MTJ devices 200_1 and 200_2 form a non-planar structure that is over the source/drain region of the transistor MM without interconnection layers.

Figure 3B:
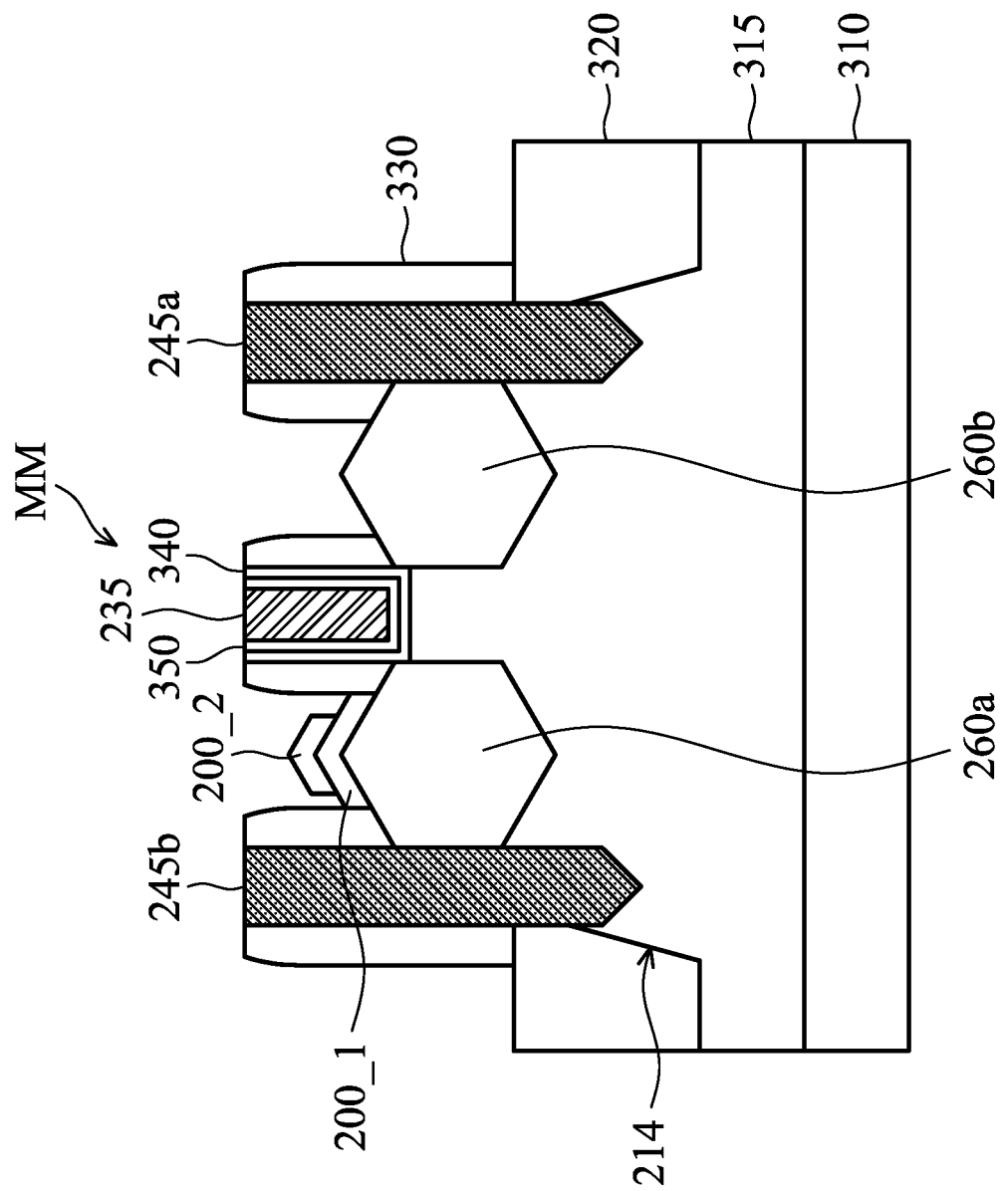
FIG. 3B shows a semiconductor structure of the MRAM cell of FIG. 3A, in accordance with some embodiments of the disclosure.

FIG. 3B shows a semiconductor structure of the MRAM cell 10_1 of FIG. 3A, in accordance with some embodiments of the disclosure. A well region 315 is formed over a semiconductor substrate 310. In some embodiments, the semiconductor substrate 310 is a Si substrate. In some embodiments, the material of the semiconductor substrate 310 is selected from a group consisting of bulk-Si, SiP, SiGe, SiC, SiPC, Ge, SOI-Si, SOI-SiGe, III-VI material, and a combination thereof. A semiconductor fin 214 is formed on the well region 315, and is surrounded by the shallow trench isolation (STI) 320.

The source/drain regions 260a and 260b of the transistor MM are formed on the semiconductor fin 214. In some embodiments, the source/drain silicide regions (not shown) are formed on the source/drain regions 260a and 260b. The gate electrode 235 is formed over the gate dielectric layer 340 and is positioned over a top surface of the semiconductor fin 214. Thus, the gate electrode 235 and the gate dielectric layer 340 over the semiconductor fin 214 form a gate structure for the transistor MM. A work-function layer 350 is formed between the gate dielectric layer 340 and the gate electrode 235. In some embodiments, the spacers 330 are formed on opposite sides of the gate electrode 235. The spacers 330 may be formed by a single layer or multiple layers.

For the transistor MM, the channel region corresponding to the semiconductor fin 214 is formed between the source/drain regions 260a and 260b and under the gate electrode 235. Furthermore, the dielectric-base gates 245a and 245b are located upon the edge of the semiconductor fin 214. For example, the dielectric-base gate 245b is arranged upon the left edge of the semiconductor fin 214, and the dielectric-base gate 245a is arranged upon the right edge of the semiconductor fin 214. Furthermore, the dielectric-base gates 245a and 245b are deeper than the source/drain regions 260a and 260b. A contact (not shown) is formed on the source/drain region 260b for connecting the source line SBL through various interconnection layers (not shown), such as the via layers and the metal layers.

In FIG. 3B, the MTJ devices 200_1 and 200_2 are formed over the source/drain region 260a. In some embodiments, the MTJ device 200_1 is formed on the source/drain region 260a and along the surface of the source/drain region 260a, and the MTJ device 200_2 is formed on the MTJ device 200_1 and along the surface of the MTJ device 200_1. Therefore, the MTJ devices 200_1 and 200_2 are non-planar. Furthermore, the MTJ device 200_2 has smaller size, and cannot completely cover the MTJ device 200_1. In some embodiments, the MTJ device 200_1 is in contact with the MTJ device 200_2 and the source/drain region 260a.

Figure 4A:
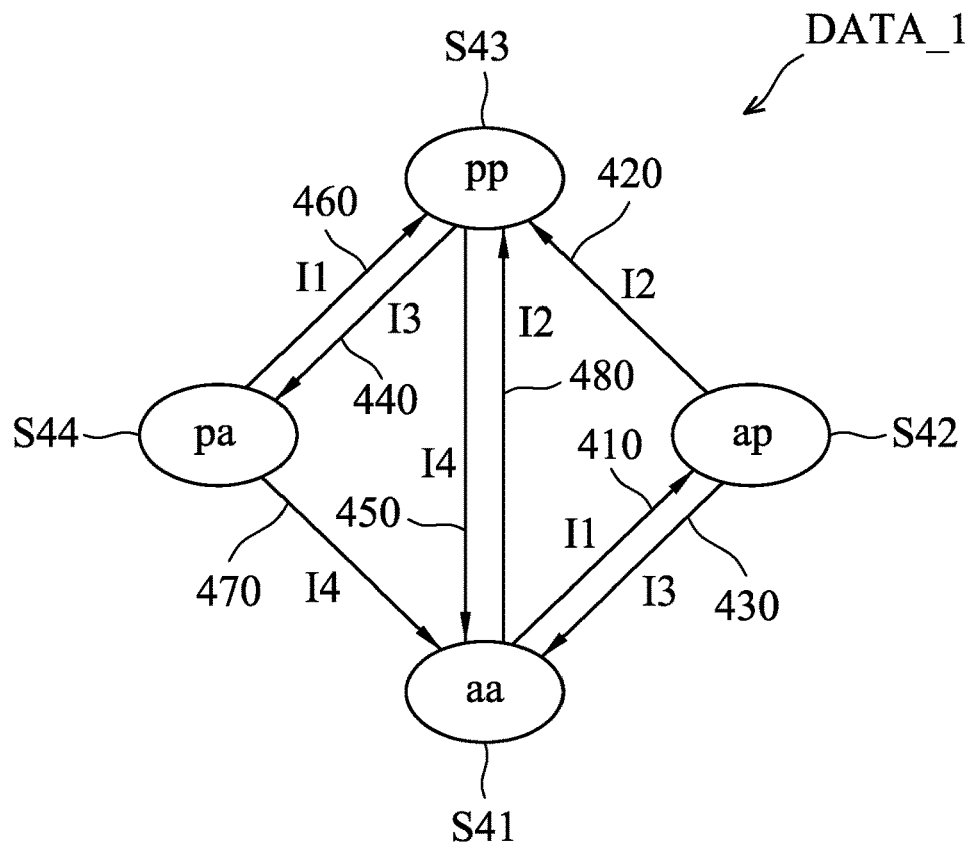
FIG. 4A shows an example state transition diagram of the data DATA_1 in the MRAM cell of FIG. 3A, in accordance with some embodiments of the disclosure.
Figure 4B:
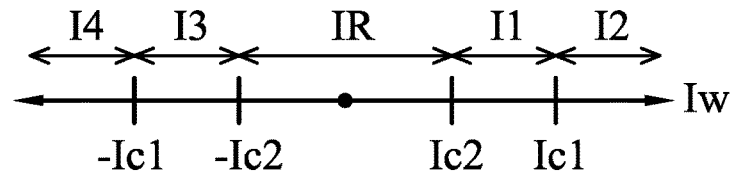
FIG. 4B shows an example illustrating the access current Iw corresponding to the state transition diagram of the data DATA_1 in FIG. 4A, in accordance with some embodiments of the disclosure.

FIG. 4A shows an example state transition diagram of the data DATA_1 in the MRAM cell 10_1 of FIG. 3A, in accordance with some embodiments of the disclosure. FIG. 4B shows an example illustrating the access current Iw corresponding to the state transition diagram of the data DATA_1 in FIG. 4A, in accordance with some embodiments of the disclosure.

In some embodiments, the MTJ devices 200_1 and 200_2 are initially operated in the anti-parallel magnetic state AP_state, the data DATA_1 has a first state S41, i.e., "aa". The first state "a" represents that the MTJ device 200_1 is operated in the anti-parallel magnetic state AP_state, and the second state "a" represents that the MTJ device 200_2 is operated in the anti-parallel magnetic state AP_state. As described above, the high resistance Rap of the anti-parallel magnetic state AP_state can represent a high logic level (i.e. "1"). The MTJ device 200_2 has smaller size than the MTJ device 200_1. Therefore, for the same access current Iw, the MTJ device 200_2 has higher current density.

If the access current Iw within a current region I1 is applying into the stacked MTJ devices 200_1 and 200_2 of the MRAM cell 10_1, the MTJ device 200_2 is switched from the anti-parallel magnetic state AP_state to the parallel magnetic state P_state due to higher current density, as shown in label 410. Thus, the data DATA_1 has a second state S42, i.e., "ap". The state "p" represents that the MTJ device 200_2 is operated in the parallel magnetic state P_state. As described above, the low resistance Rp of the parallel magnetic state P_state can represent a low logic level (i.e. "0"). The current region I1 is between the current values Ic2 and Ic1. In other words, for the data DATA_1, the access current Iw that is capable of switching the first state S41 to the second state S42, is less than the current value Ic1 and greater than the current value Ic2.

In the second state S42, if the access current Iw within a current region 12 is applying into the stacked MTJ devices 200_1 and 200_2 of the MRAM cell 10_1, the MTJ device 200_1 is switched from the anti-parallel magnetic state AP_state to the parallel magnetic state P_state, as shown in label 420. Thus, the data DATA_1 has a third state S43, i.e., "pp". The current region 12 is greater than the current value Ic1. In other words, for the data DATA_1 with the second state S42, the access current Iw that is capable of switching the second state S42 to the third state S43, is greater than the current value Ic1.

In the second state S42, if the access current Iw within a current region 13 is applying into the stacked MTJ devices 200_1 and 200_2 of the MRAM cell 10_1, the MTJ device 200_2 is switched from the parallel magnetic state P_state to the anti-parallel magnetic state AP_state, as shown in label 430. Thus, the data DATA_1 has the first state S41. The current region 13 is between the current values –Ic2 and –Ic1. In other words, for the data DATA_1 with the second state S42, the access current Iw that is capable of switching the second state S42 to the first state S41, is greater than the current value –Ic1 and less than the current value –Ic2.

In the third state S43, if the access current Iw within a current region 14 is applying into the stacked MTJ devices 200_1 and 200_2 of the MRAM cell 10_1, the MTJ devices 200_1 and 200_2 are switched from the parallel magnetic state P_state to the anti-parallel magnetic state AP_state, as shown in label 450. Thus, the data DATA_1 has the first state S41. The current region 14 is less than the current value –Ic1. In other words, for the data DATA_1 with the third state S43, the access current Iw that is capable of switching the third state S43 to the first state S41, is less than the current value –Ic1.

In the third state S43, if the access current Iw within the current region 13 is applying into the stacked MTJ devices 200_1 and 200_2 of the MRAM cell 10_1, the MTJ device 200_2 is switched from the parallel magnetic state P_state to the anti-parallel magnetic state AP_state, as shown in label 440. Thus, the data DATA_1 has a fourth state S44, i.e., "pa".

In the fourth state S44, if the access current Iw within the current region I1 is applying into the stacked MTJ devices 200_1 and 200_2 of the MRAM cell 10_1, the MTJ device 200_2 is switched from the anti-parallel magnetic state AP_state to the parallel magnetic state P_state, as shown in label 470. Thus, the data DATA_1 has the third state S43.

In the fourth state S44, if the access current Iw within the current region 14 is applying into the stacked MTJ devices 200_1 and 200_2 of the MRAM cell 10_1, the MTJ device 200_1 is switched from the parallel magnetic state P_state to the anti-parallel magnetic state AP_state, as shown in label 470. Thus, the data DATA_1 has the first state S41.

In the first state S41, if the access current Iw within the current region 12 is applying into the stacked MTJ devices 200_1 and 200_2 of the MRAM cell 10_1, the MTJ devices 200_1 and 200_2 are switched from the anti-parallel magnetic state AP_state to the parallel magnetic state P_state, as shown in label 480. Thus, the data DATA_1 has the third state S43.

Specifically, the access current Iw within the current regions I1 through 14 is a writing current for storing the two-bit data DATA_1 in the MRAM cell 10_1. Conversely, the access current Iw within the current region IR (i.e. –Ic2<Iw<Ic2) is a sense current for reading the two-bit data DATA_1 stored in the MRAM cell 10_1. In some embodiments, the four states S41 through S44 of the stacked MTJ devices 200_1 and 200_2 are used to represent the four logic levels "11", "10", "00" and "01" of the two-bit data DATA_1, respectively.

In some embodiments, the access current Iw within the current region I1 is capable of controlling the magnetization directions of the free layer 210 and the pinned layer 230 of the MTJ device 200_2 as the parallel magnetic state P_state, and the access current Iw within the current region 13 is capable of controlling the magnetization directions of the free layer 210 and the pinned layer 230 of the MTJ device 200_2 as the anti-parallel magnetic state AP_state. The access current Iw within the current region 12 is capable of controlling the magnetization directions of the free layer 210 and the pinned layer 230 of the MTJ device 200_1 as the parallel magnetic state P_state, and the access current Iw within the current region 14 is capable of controlling the magnetization directions of the free layer 210 and the pinned layer 230 of the MTJ device 200_1 as the anti-parallel magnetic state AP_state.

Figure 5:
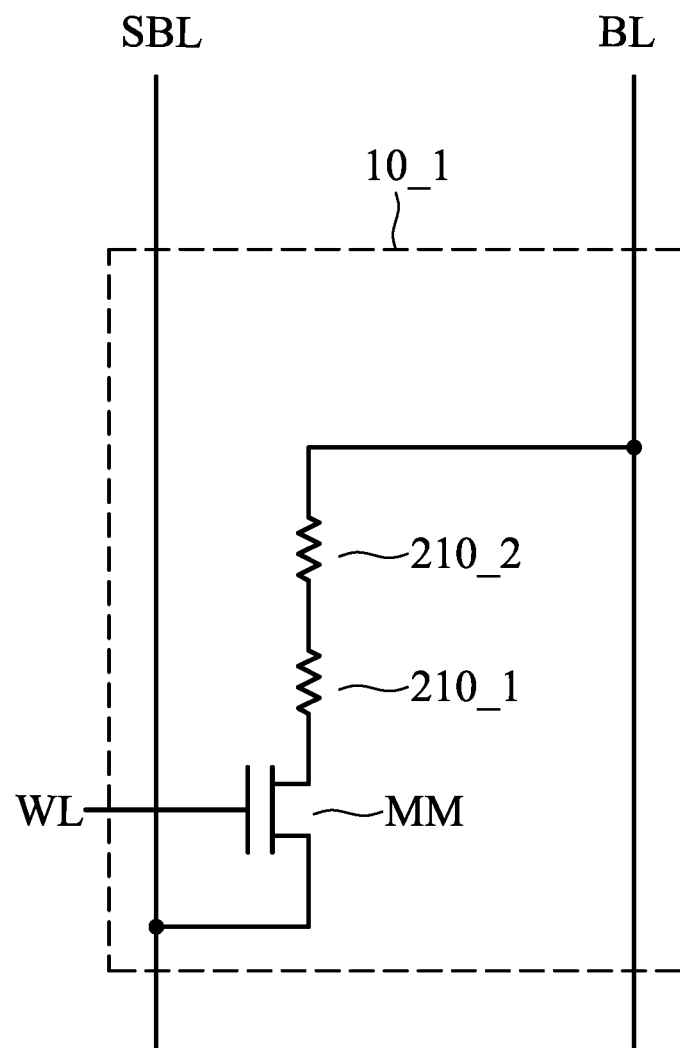
FIG. 5 shows an example schematic illustrating an equivalent circuit of the MRAM cell in FIG. 3A, in accordance with some embodiments of the disclosure.

FIG. 5 shows an example schematic illustrating an equivalent circuit of the MRAM cell 10_1 in FIG. 3A, in accordance with some embodiments of the disclosure. In FIG. 5, the resistor 210_1 represents the equivalent resistor of the MTJ device 200_1 of FIG. 3A. Furthermore, the resistor 210_2 represents the equivalent resistor of the MTJ device 200_2 of FIG. 3A. The resistors 210_1 and 210_2 are coupled in series between the transistor MM and the bit line BL. When the MTJ device 200_1 is in the anti-parallel magnetic state AP_state, the equivalent impedance of the resistor 210_1 is Rap1. Conversely, when the MTJ device 200_1 is in the parallel magnetic state P_state, the equivalent impedance of the resistor 210_1 is Rp1, where Rp1<Rap1. Similarly, when the MTJ device 200_2 is in the anti-parallel magnetic state AP_state, the equivalent impedance of the resistor 210_2 is Rap2. Conversely, when the MTJ device 200_2 is in the parallel magnetic state P_state, the equivalent impedance of the resistor 210_2 is Rp2, where Rp2<Rap2.

In the MRAM cell 10_1, the MTJ device 200_2 has smaller size than the MTJ device 200_1. For the same access current Iw, the MTJ device 200_2 has larger current density than the MTJ device 200_1. Thus, the equivalent impedance of the resistor 210_2 corresponding to the MTJ device 200_2 is greater than the equivalent impedance of the resistor 210_1 corresponding to the MTJ device 200_1, i.e., Rp2>Rp1 and Rap2>Rap1.

FIG. 6 shows a table illustrating the relationship of the access current Iw and the equivalent impedance of stacked MTJ devices 200_1 and 200_2. In FIG. 6, the second row of the table represents the equivalent impedance "MTJ1" of the resistor 210_1 corresponding to the MTJ device 200_1 in response to the access current Iw. The third row of the table represents the equivalent impedance "MTJ2" of the resistor 210_2 corresponding to the MTJ device 200_2 in response to the access current Iw. The fourth row of the table represents the magnetic states of stacked MTJ devices 200_1 and 200_2 (i.e., the state S41, S42, S43 or S44 of the MRAM cell 10_1) in response to the access current Iw. The fifth row of the table represents the equivalent impedance Serial-R of the stacked MTJ devices 200_1 and 200_2 in response to the access current Iw.

In the second column of the table of FIG. 6, the access current Iw is within the current region IR of FIG. 4B, e.g., an initial current region or a read current region. At this time, the equivalent impedance MTJ1 is Rap1, and the equivalent impedance MTJ2 is Rap2. Furthermore, the MRAM cell 10_1 has the first state S41 (e.g., "aa"), and the equivalent impedance Serial-R of the stacked MTJ devices 200_1 and 200_2 is equal to Rap1+Rap2.

In the third column of the table of FIG. 6, the access current Iw is within the current region I1 of FIG. 4B, e.g., Ic2<Iw<Ic1. At this time, the equivalent impedance MTJ1 is Rap1, and the equivalent impedance MTJ2 is Rp2. Furthermore, the MRAM cell 10_1 has the first state S42 (e.g., "ap"), and the equivalent impedance Serial-R of the stacked MTJ devices 200_1 and 200_2 is equal to Rap1+Rp2.

In the fourth column of the table of FIG. 6, the access current Iw is within the current region I2 of FIG. 4B, e.g., Iw>Ic1. At this time, the equivalent impedance MTJ1 is Rp1, and the equivalent impedance MTJ2 is Rp2. Furthermore, the MRAM cell 10_1 has the first state S43 (e.g., "pp"), and the equivalent impedance Serial-R of the stacked MTJ devices 200_1 and 200_2 is equal to Rp1+Rp2.

In the fifth column of the table of FIG. 6, the access current Iw is within the current region I3 of FIG. 4B, e.g., −Ic1<Iw<−Ic2. At this time, the equivalent impedance MTJ1 is Rp1, and the equivalent impedance MTJ2 is Rap2. Furthermore, the MRAM cell 10_1 has the first state S44 (e.g., "pa"), and the equivalent impedance Serial-R of the stacked MTJ devices 200_1 and 200_2 is equal to Rp1+Rap2.

In the sixth column of the table of FIG. 6, the access current Iw is within the current region I4 of FIG. 4B, e.g., Iw<−Ic1. At this time, the equivalent impedance MTJ1 is Rap1, and the equivalent impedance MTJ2 is Rap2. Furthermore, the MRAM cell 10_1 has the first state S41, and the equivalent impedance Serial-R of the stacked MTJ devices 200_1 and 200_2 is Rap1+Rap2.

In FIG. 6, each of the states S41 through S44 has individual equivalent impedance. Thus, by providing the sense signal (current or voltage) to obtain the equivalent impedance Serial-R of the stacked MTJ devices 200_1 and 200_2 in the MRAM cell 10_1, the current state of the MRAM cell 10_1 is obtained. According to the current state of the MRAM cell 10_1, the data DATA_1 stored in the MRAM cell 10_1 is obtained. Next, according to the state transition diagram of the data DATA_1 of FIG. 4A, the desired state corresponding to new data DATA_1 that is to be written into the MRAM cell 10_1, is reached with one or more write operations.

For example, if the current state of the MRAM cell 10_1 is the second state S42 and the desired state of the MRAM cell 10_1 is the fourth state S44, the controller 130 is configured to provide the access current Iw within the current range I2 to the MRAM cell 10_1, so as to change the second state S42 to the third state S43. Next, the controller 130 is configured to provide the access current Iw within the current range I3 to the MRAM cell 10_1, so as to change the third state S43 to the fourth state S44. Thus, the new data DATA_1 is stored in the MRAM cell 10_1.

Figure 7:
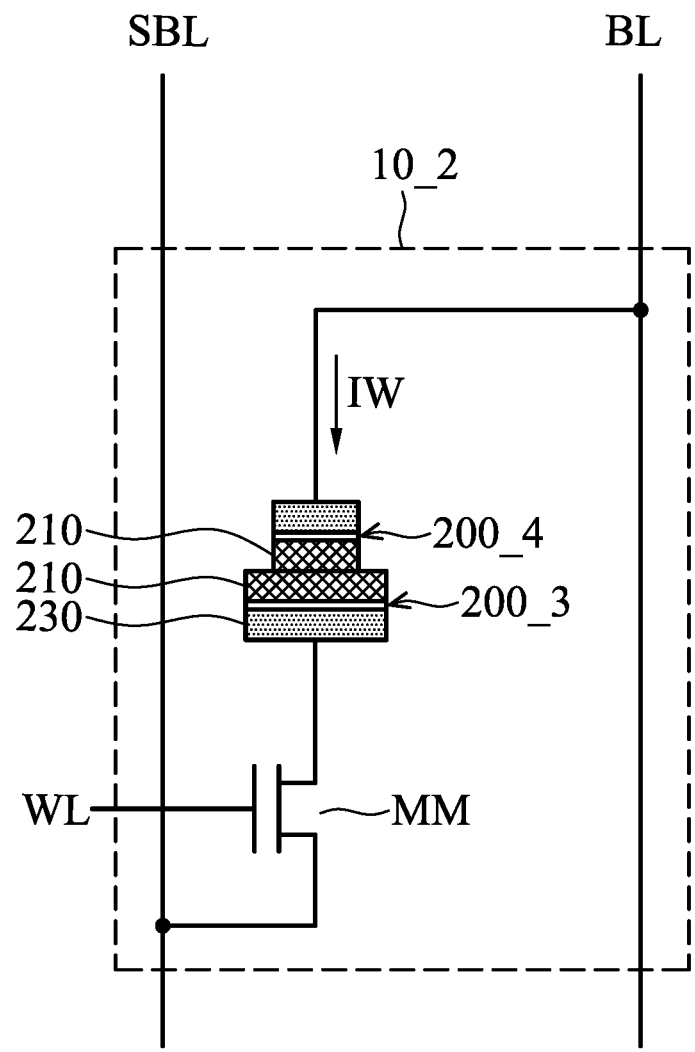
FIG. 7 shows an example schematic of an MRAM cell, in accordance with some embodiments of the disclosure.

FIG. 7 shows an example schematic of an MRAM cell 10_2, in accordance with some embodiments of the disclosure. The MRAM cell 10_2 includes a transistor MM and the MTJ devices 200_3 and 200_4 coupled in series. The transistor MM is coupled between a source line SBL and the MTJ device 200_3, and a gate of the transistor MM is coupled to a word line WL. The MTJ devices 200_3 and 200_4 are stacked between the transistor MM and a bit line BL. The MRAM cell 10_2 is capable of storing two-bit data DATA_2 based on the stacked MTJ devices 200_3 and 200_4. As described above, by applying the access current Iw to the stacked MTJ devices 200_3 and 200_4, the MTJ device 200_3 and/or 200_4 is switched from a parallel magnetic state P_state to an anti-parallel magnetic state AP_state or from the anti-parallel magnetic state AP_state to the parallel magnetic state P_state.

In the MRAM cell 10_2, the free layer 210 of the MTJ device 200_3 is in contact with the free layer 210 of the MTJ device 200_4. In some embodiments, a conducting layer (e.g., an electrode) is formed between the free layers 210 of the MTJ devices 200_3 and 200_4. It should be noted that the MTJ devices 200_3 and 200_4 are different sizes.

In some embodiments, the thickness of the free layers 210 of the MTJ devices 200_3 and 200_4 are the same. Furthermore, the thickness of the barrier layer 220 of the MTJ devices 200_3 and 200_4 are the same, and the thickness of the pinned layer 230 of the MTJ devices 200_3 and 200_4 are the same. The difference between the MTJ devices 200_3 and 200_4 is that the area of the free layer 210, the barrier layer 220 and the pinned layer 230 of the MTJ device 200_3 is greater than that of the MTJ device 200_4. Thus, the equivalent impedances of the MTJ devices 200_3 and 200_4 are different.

In some embodiments, the thickness of the free layers 210 of the MTJ devices 200_3 and 200_4 are the same, and the thickness of the pinned layer 230 of the MTJ devices 200_3 and 200_4 are the same. Furthermore, the area of the free layer 210, the barrier layer 220 and the pinned layer 230 of the MTJ device 200_3 is the same as that of the MTJ device 200_4. The difference between the MTJ devices 200_3 and 200_4 is that the thickness of the barrier layer 220 of the MTJ devices 200_3 and 200_4 are different. Thus, the equivalent impedances of the MTJ devices 200_3 and 200_4 are different.

Figure 8A:
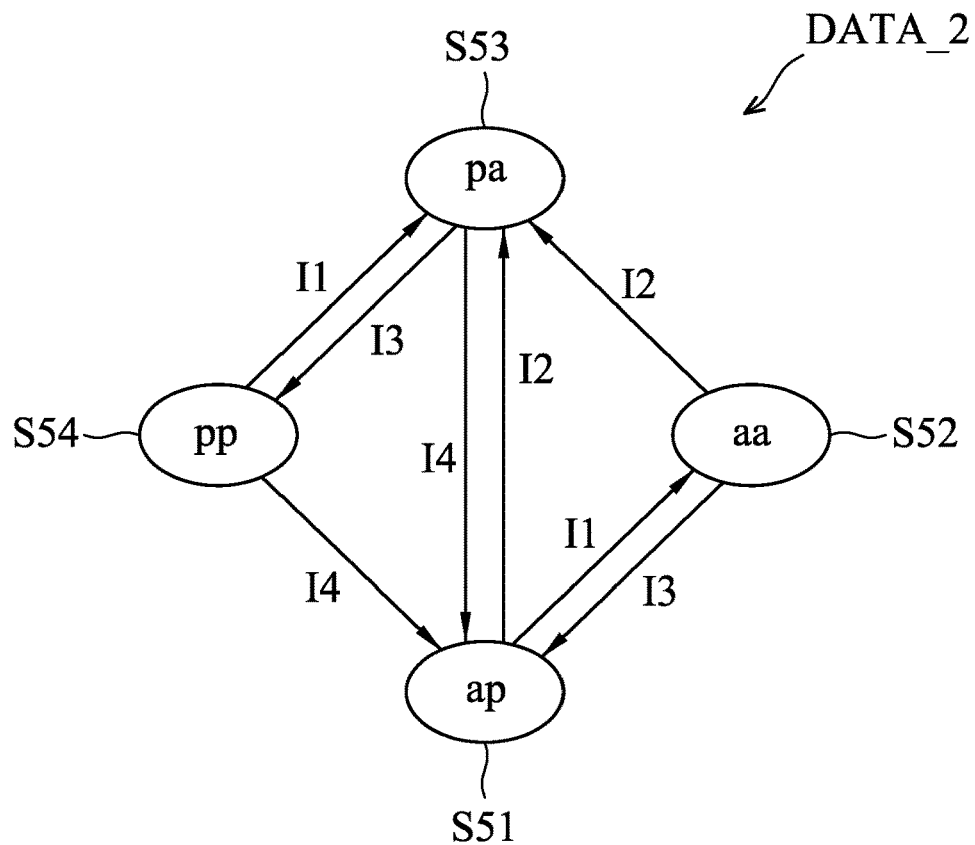
FIG. 8A shows an example state transition diagram of the data DATA_2 in the MRAM cell of FIG. 7, in accordance with some embodiments of the disclosure.
Figure 8B:
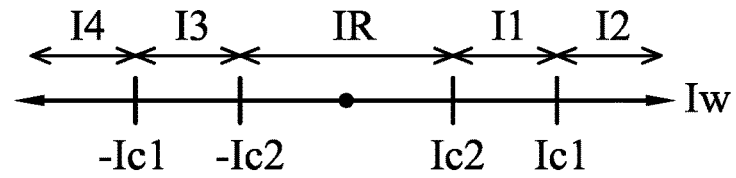
FIG. 8B shows an example illustrating the access current Iw corresponding to the state transition diagram of the in FIG. 8A, in accordance with some embodiments of the disclosure.

FIG. 8A shows an example state transition diagram of the data DATA_2 in the MRAM cell 10_2 of FIG. 7, in accordance with some embodiments of the disclosure. FIG. 8B shows an example illustrating the access current Iw corresponding to the state transition diagram of the data DATA_2 in FIG. 8A, in accordance with some embodiments of the disclosure.

In FIG. 8A, the data DATA_2 have four states S51 through S54. In the first state S51 (i.e., "ap"), the MTJ device 200_3 is operated in the anti-parallel magnetic state AP_state and the MTJ device 200_4 is operated in the parallel magnetic state P_state. In the second state S52 (i.e., "aa"), the MTJ devices 200_3 and 200_4 are operated in the anti-parallel magnetic state AP_state. In the third state S53 (i.e., "pa"), the MTJ device 200_3 is operated in the parallel magnetic state P_state and the MTJ device 200_4 is operated in the anti-parallel magnetic state AP_state. In the fourth state S54 (i.e., "pp"), the MTJ devices 200_3 and 200_4 are operated in the parallel magnetic state P_state.

The access current Iw within the current regions I1 through I4 is a writing current for storing the two-bit data DATA_2 in the MRAM cell 10_2. Conversely, the access current Iw within the current region IR (i.e. −Ic2<Iw<Ic2) is a sense current for reading the two-bit data DATA_2 stored in the MRAM cell 10_2.

In some embodiments, the access current Iw within the current region I1 is capable of controlling the magnetization directions of the free layer 210 and the pinned layer 230 of the MTJ device 200_4 as the anti-parallel magnetic state AP_state, and the access current Iw within the current region I3 is capable of controlling the magnetization directions of the free layer 210 and the pinned layer 230 of the MTJ device 200_4 as the parallel magnetic state P_state. The access current Iw within the current region I2 is capable of controlling the magnetization directions of the free layer 210 and the pinned layer 230 of the MTJ device 200_3 as the parallel magnetic state P_state, and the access current Iw within the current region I4 is capable of controlling the magnetization directions of the free layer 210 and the pinned layer 230 of the MTJ device 200_3 as the anti-parallel magnetic state AP_state.

As previously described in FIG. 6, each of the states S51 through S54 has individual equivalent impedance. Thus, by providing the sense signal (current or voltage) to obtain the equivalent impedance of the stacked MTJ devices 200_3 and 200_4 in the MRAM cell 10_2, the current state of the MRAM cell 10_2 is obtained. According to the current state of the MRAM cell 10_2, the data DATA_2 stored in the MRAM cell 10_2 is obtained. Next, according to the state transition diagram of the data DATA_2 of FIG. 8A, the desired state corresponding to new data DATA_2 that is to be written into the MRAM cell 10_2 is reached with one or more write operations.

For example, if the current state of the MRAM cell 10_2 is the fourth state S54 and the desired state of the MRAM cell 10_2 is the second state S52, the controller 130 is configured to provide the access current Iw within the current range I4 to the MRAM cell 10_2, so as to change the fourth state S54 to the first state S51. Next, the controller 130 is configured to provide the access current Iw within the current range I1 to the MRAM cell 10_2, so as to change the first state S51 to the second state S52. Thus, the new data DATA_2 is stored in the MRAM cell 10_2.

Figure 9:
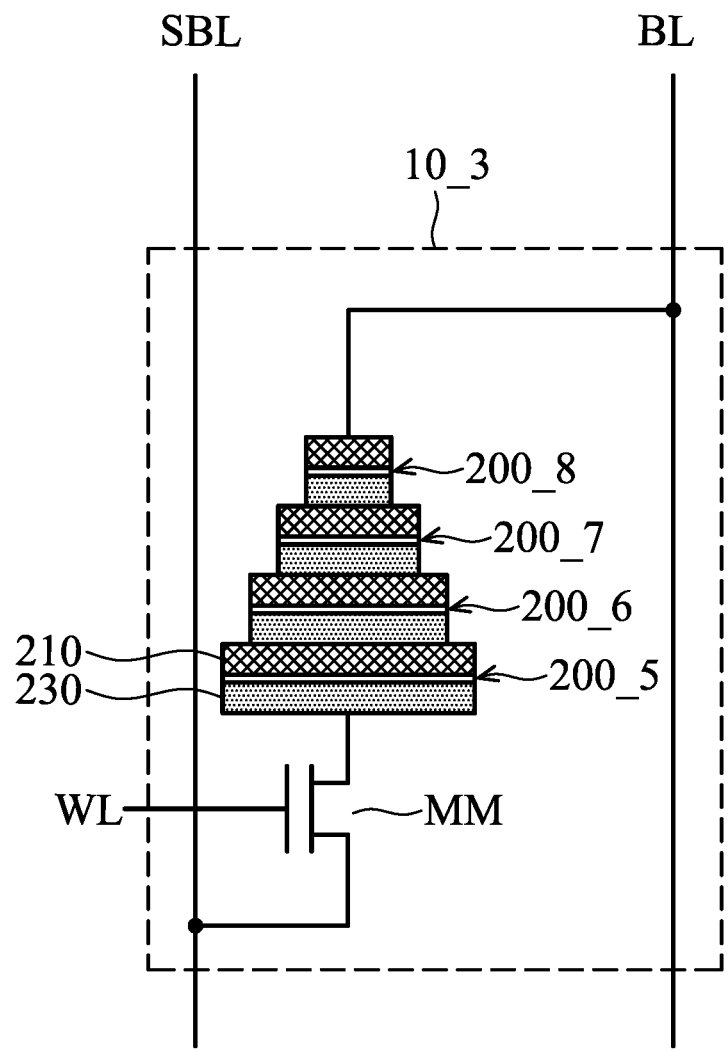
FIG. 9 shows an example schematic of an MRAM cell, in accordance with some embodiments of the disclosure.

FIG. 9 shows an example schematic of an MRAM cell 10_3, in accordance with some embodiments of the disclosure. The MRAM cell 10_3 includes a transistor MM and the MTJ devices 200_5 through 200_8 coupled in series. The transistor MM is coupled between a source line SBL and the MTJ device 200_5, and a gate of the transistor MM is coupled to a word line WL. The MTJ devices 200_5 through 200_8 are stacked between the transistor MM and a bit line BL. The MRAM cell 10_3 is capable of storing three-bit data DATA_3 based on the stacked MTJ devices 200_5 through 200_8. As described above, by applying the access current Iw to the stacked MTJ devices 200_5 through 200_8, the MTJ devices 200_5, 200_6, 200_7 and/or 200_8 is switched from a parallel magnetic state P_state to an anti-parallel magnetic state AP_state or from the anti-parallel magnetic state AP_state to the parallel magnetic state P_state.

In the MRAM cell 10_3, the free layer 210 of the MTJ device 200_5 is in contact with the pinned layer 230 of the MTJ device 200_6, the free layer 210 of the MTJ device 200_6 is in contact with the pinned layer 230 of the MTJ device 200_7, and the free layer 210 of the MTJ device 200_7 is in contact with the pinned layer 230 of the MTJ device 200_8. In some embodiments, a conducting layer (e.g., an electrode) is formed between two adjacent MTJ devices. It should be noted that the MTJ devices 200_5 through 200_8 are different sizes.

In some embodiments, the thickness of the free layers 210 of the MTJ devices 200_5 through 200_8 are the same. Furthermore, the thickness of the barrier layer 220 of the MTJ devices 200_5 through 200_8 are the same, and the thickness of the pinned layer 230 of the MTJ devices 200_5 through 200_8 are the same. The difference between the MTJ devices 200_5 through 200_8 is that the area of the free layer 210, the barrier layer 220 and the pinned layer 230 of the MTJ device 200_5 is greater than that of the MTJ device 200_6, and the area of the free layer 210, the barrier layer 220 and the pinned layer 230 of the MTJ device 200_6 is greater than that of the MTJ device 200_7. Furthermore, the area of the free layer 210, the barrier layer 220 and the pinned layer 230 of the MTJ device 200_7 is greater than that of the MTJ device 200_8. Thus, the equivalent impedances of the MTJ devices 200_5 through 200_8 are different.

In some embodiments, the thickness of the free layers 210 of the MTJ devices 200_5 through 200_8 are the same, and the thickness of the pinned layer 230 of the MTJ devices 200_5 through 200_8 are the same. Furthermore, the area of the free layer 210, the barrier layer 220 and the pinned layer 230 of the MTJ devices 200_5 through 200_8 are the same. The difference between the MTJ devices 200_5 through 200_8 is that the thickness of the barrier layer 220 of the MTJ devices 200_5 through 200_8 are different. Thus, the equivalent impedances of the MTJ devices 200_5 through 200_8 are different.

Figure 10A:
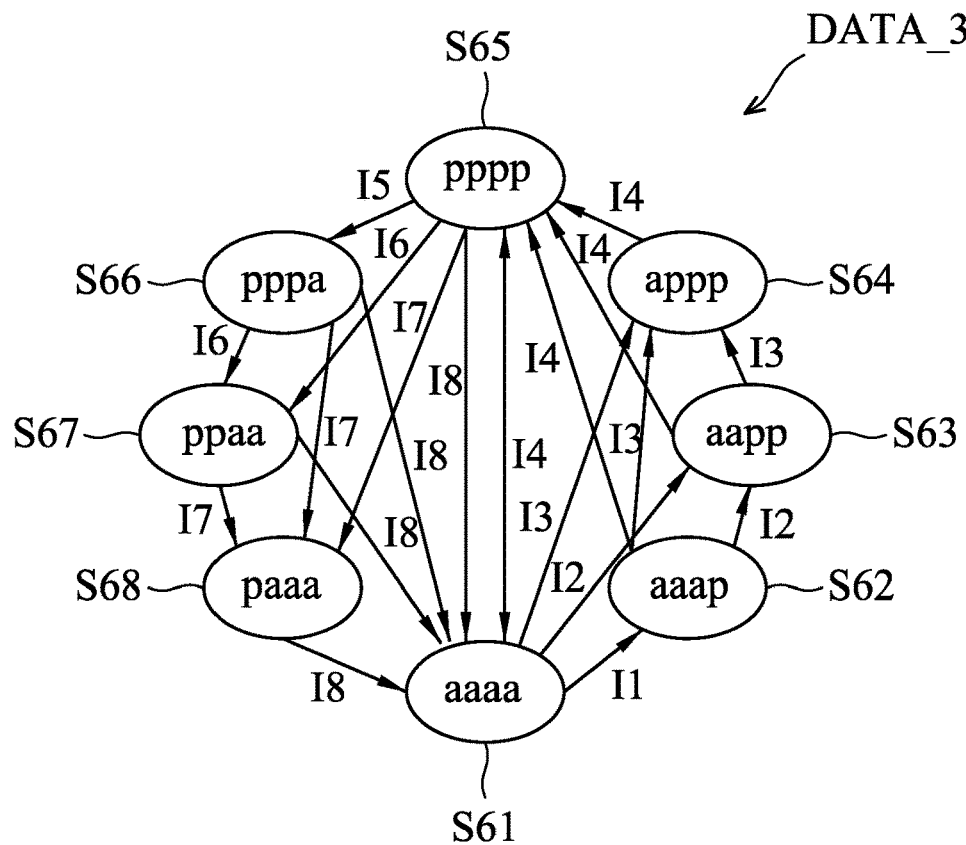
FIG. 10A shows an example state transition diagram of the data DATA_3 in the MRAM cell of FIG. 9, in accordance with some embodiments of the disclosure.
Figure 10B:
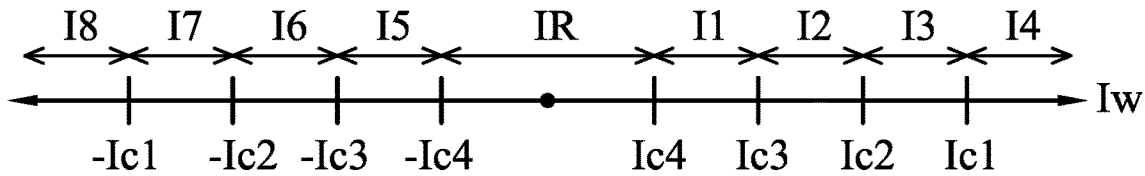
FIG. 10B shows an example illustrating the access current Iw corresponding to the state transition diagram of the data DATA_3 in FIG. 10A, in accordance with some embodiments of the disclosure.

FIG. 10A shows an example state transition diagram of the data DATA_3 in the MRAM cell 10_3 of FIG. 9, in accordance with some embodiments of the disclosure. FIG. 10B shows an example illustrating the access current Iw corresponding to the state transition diagram of the data DATA_3 in FIG. 10A, in accordance with some embodiments of the disclosure. In FIG. 10A, the data DATA_3 have eight states S61 through S68.

In the first state S61 (i.e., "aaaa"), the MTJ devices 200_5 through 200_8 are operated in the anti-parallel magnetic state AP_state.

In the second state S62 (i.e., "aaap"), the MTJ devices 200_5 through 200_7 are operated in the anti-parallel magnetic state AP_state, and the MTJ device 200_8 is operated in the parallel magnetic state.

In the third state S63 (i.e., "aapp"), the MTJ devices 200_5 and 200_6 are operated in the anti-parallel magnetic state AP_state, and the MTJ devices 200_7 and 200_8 are operated in the parallel magnetic state.

In the fourth state S64 (i.e., "appp"), the MTJ device 200_5 is operated in the anti-parallel magnetic state AP_state, and the MTJ devices 200_6 through 200_8 are operated in the parallel magnetic state.

In the fifth state S65 (i.e., "pppp"), the MTJ devices 200_5 through 200_8 are operated in the parallel magnetic state.

In the sixth state S66 (i.e., "pppa"), the MTJ devices 200_5 through 200_7 are operated in the parallel magnetic state, and the MTJ device 200_8 is operated in the anti-parallel magnetic state AP_state.

In the sixth state S67 (i.e., "ppaa"), the MTJ devices 200_5 and 200_6 are operated in the parallel magnetic state, and the MTJ devices 200_7 and 200_8 are operated in the anti-parallel magnetic state AP_state.

In the sixth state S68 (i.e., "paaa"), the MTJ device 200_5 is operated in the parallel magnetic state, and the MTJ devices 200_6 through 200_8 are operated in the anti-parallel magnetic state AP_state.

The access current Iw within the current regions I1 through I8 is a writing current for storing the three-bit data DATA_3 in the MRAM cell 10_3. Conversely, the access current Iw within the current region IR (i.e. −Ic4<Iw<Ic4) is a sense current for reading the three-bit data DATA_3 stored in the MRAM cell 10_3.

The current region I1 is greater than the current value Ic4 and less than the current value Ic3, and the current region I2 is greater than the current value Ic3 and less than the current value Ic2. Furthermore, the current region I3 is greater than the current value Ic2 and less than the current value Ic1, and the current region I4 is greater than the current value Ic4. Moreover, the current region I5 is greater than the current value −Ic3 and less than the current value −Ic4, and the current region I6 is greater than the current value −Ic2 and less than the current value −Ic3. In addition, the current region I7 is greater than the current value −Ic1 and less than the current value −Ic2, and the current region I8 is less than the current value −Ic1.

In some embodiments, the access current Iw within the current region I1 is capable of controlling the magnetization directions of the free layer 210 and the pinned layer 230 of the MTJ device 200_8 as the parallel magnetic state P_state, and the access current Iw within the current region I5 is capable of controlling the magnetization directions of the free layer 210 and the pinned layer 230 of the MTJ device 200_8 as the anti-parallel magnetic state AP_state. In some embodiments, the access current Iw within the current region I2 is capable of controlling the magnetization directions of the free layer 210 and the pinned layer 230 of the MTJ device 200_7 as the parallel magnetic state P_state, and the access current Iw within the current region I6 is capable of controlling the magnetization directions of the free layer 210 and the pinned layer 230 of the MTJ device 200_7 as the anti-parallel magnetic state AP_state.

In some embodiments, the access current Iw within the current region I3 is capable of controlling the magnetization directions of the free layer 210 and the pinned layer 230 of the MTJ device 200_6 as the parallel magnetic state P_state, and the access current Iw within the current region I7 is capable of controlling the magnetization directions of the free layer 210 and the pinned layer 230 of the MTJ device 200_6 as the anti-parallel magnetic state AP_state. In some embodiments, the access current Iw within the current region I4 is capable of controlling the magnetization directions of the free layer 210 and the pinned layer 230 of the MTJ device 200_5 as the parallel magnetic state P_state, and the access current Iw within the current region I8 is capable of controlling the magnetization directions of the free layer 210 and the pinned layer 230 of the MTJ device 200_5 as the anti-parallel magnetic state AP_state.

Figure 11:
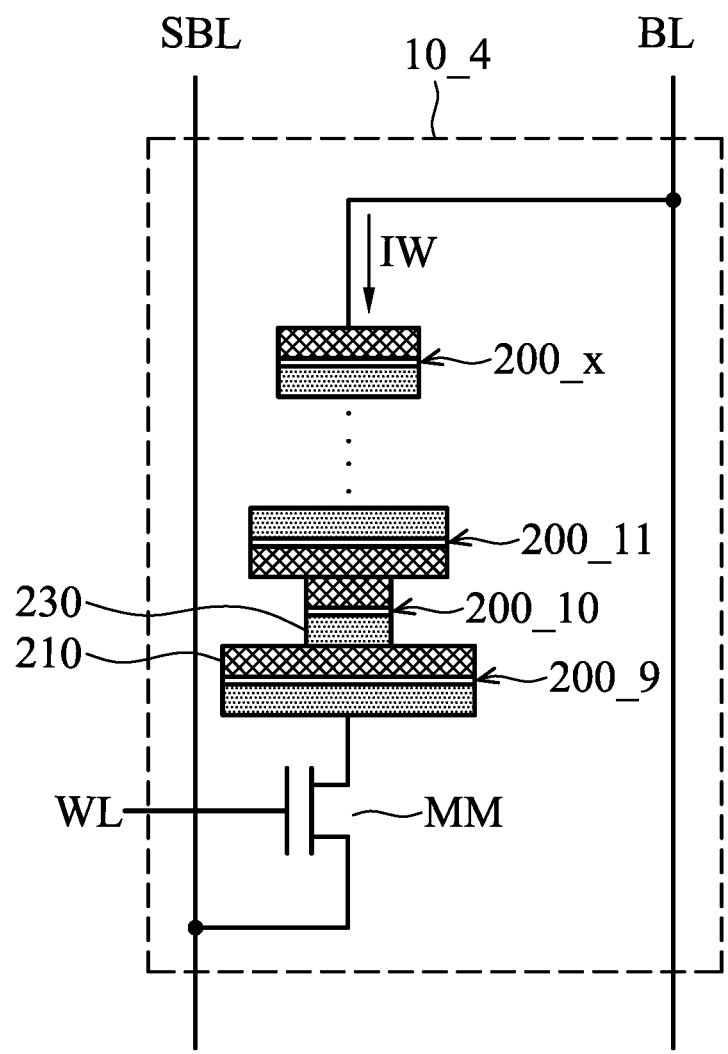
FIG. 11 shows an example schematic of an MRAM cell, in accordance with some embodiments of the disclosure.

FIG. 11 shows an example schematic of an MRAM cell 10_4, in accordance with some embodiments of the disclosure. The MRAM cell 10_4 includes a transistor MM and the MTJ devices 200_9 through 200_x coupled in series. The transistor MM is coupled between a source line SBL and the MTJ device 200_9, and a gate of the transistor MM is coupled to a word line WL. The MTJ devices 200_9 through 200_x are stacked between the transistor MM and a bit line BL. The MRAM cell 10_4 is capable of storing m-bit data DATA_4 based on the stacked MTJ devices 200_9 through 200_x. As described above, by applying the access current Iw to the stacked MTJ devices 200_9 through 200_x, the MTJ devices 200_9 through 200_x can be switched from a parallel magnetic state P_state to an anti-parallel magnetic state AP_state or from the anti-parallel magnetic state AP_state to the parallel magnetic state P_state, respectively.

In the MRAM cell 10_4, the free layer 210 of the MTJ device 200_9 is in contact with the pinned layer 230 of the MTJ device 200_10, and the free layer 210 of the MTJ device 200_10 is in contact with the free layer 210 of the MTJ device 200_11. In some embodiments, a conducting layer (e.g., an electrode) is formed between two adjacent MTJ devices. Furthermore, the MTJ devices 200_9 through 200_x are different sizes. For example, the area of the MTJ device 200_9 is greater than that of the MTJ device 200_11, and the area of the MTJ device 200_11 is greater than that of the MTJ device 200_10. As described above, the equivalent impedances of the MTJ devices 200_9 through 200_x are different. Furthermore, the stacked configuration of the MTJ devices 200_9 through 200_x is determined according to different applications. In other words, the sort order and connection type of the MTJ devices 200_9 through 200_x are adjustable based on the related applications.

In each MRAM cell, the bit number of data stored in the MRAM cell is determined according to the number of MTJ devices within the MRAM cell. For example, in the MRAM cell 10_4, the number of MTJ devices 200_9 through 200_x is N, and the data DATA_4 have 2N states. Furthermore, the bit number m of the data DATA_4 is obtained according to according to the following equation:

$$m = \mathrm{Log}_2(2 \times N).$$

As described above, each of the N states of the data DATA_4 has individual equivalent impedance. Thus, by providing the sense signal (current or voltage) to obtain the equivalent impedance of the stacked MTJ devices 200_9 through 200_x in the MRAM cell 10_4, the current state of the MRAM cell 10_4 is obtained. According to the current state of the MRAM cell 10_4, the data DATA_4 stored in the MRAM cell 10_4 is obtained. Next, according to the states of the data DATA_4, the desired state corresponding to new data DATA_4 that is to be written into the MRAM cell 10_4 is reached with one or more write operations.

Figure 12:
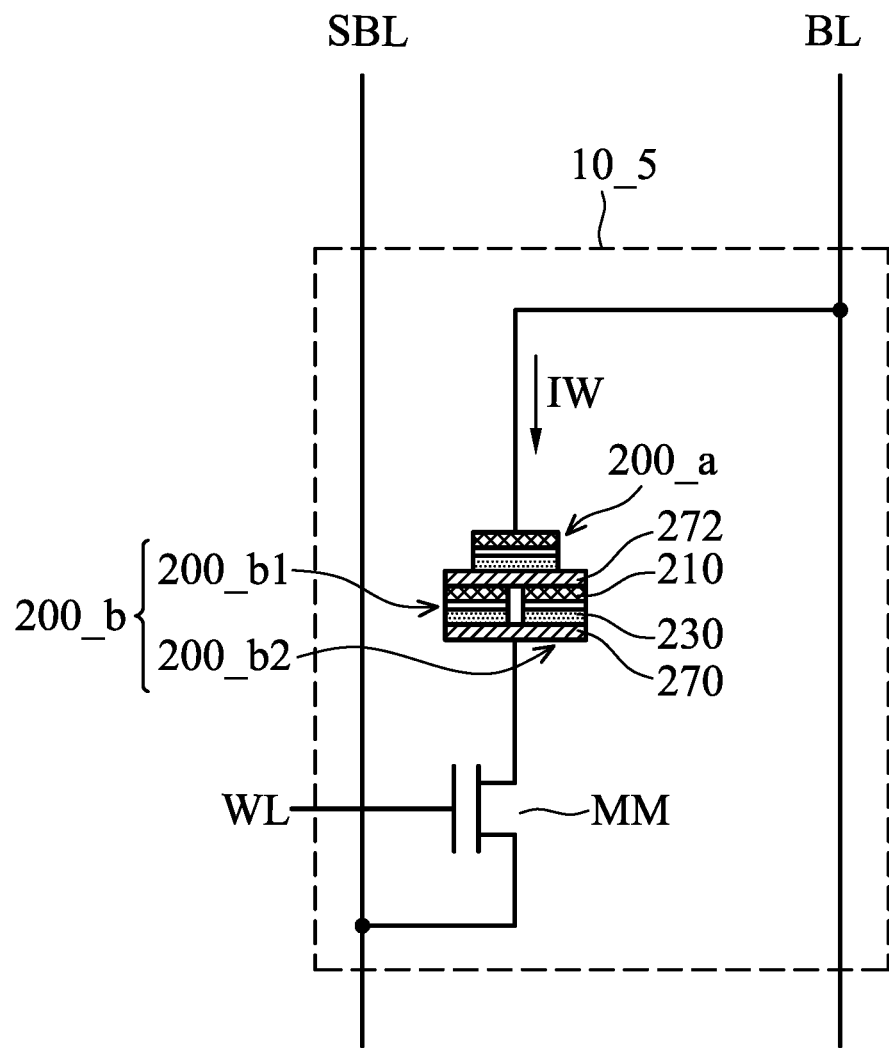
FIG. 12 shows an example schematic of an MRAM cell, in accordance with some embodiments of the disclosure.

FIG. 12 shows an example schematic of an MRAM cell 10_5, in accordance with some embodiments of the disclosure. The MRAM cell 10_5 includes a transistor MM and the MTJ devices 200_a and 200_b coupled in series. The transistor MM is coupled between a source line SBL and the MTJ device 200_b, and a gate of the transistor MM is coupled to a word line WL. The MTJ devices 200_a and 200_b are stacked between the transistor MM and a bit line BL. The MRAM cell 10_5 is capable of storing data based on the stacked MTJ devices 200_a and 200_b. As described above, by applying the access current Iw to the stacked MTJ devices 200_a and 200_b, the MTJ device 200_a and/or 200_b is switched from a parallel magnetic state P_state to an anti-parallel magnetic state AP_state or from the anti-parallel magnetic state AP_state to the parallel magnetic state P_state.

In the MRAM cell 10_5, the MTJ device 200_b is formed by the MTJ sub-devices 200_b1 and 200_b2. The MTJ sub-devices 200_b1 and 200_b2 are coupled in parallel between the conducting layers 270 and 272 (e.g., electrodes). The conducting layers 270 and 272 are formed in different levels. The pinned layers 230 of the MTJ sub-devices 200_b1 and 200_b2 are in contact with the conducting layer 270, and the free layers 210 of the MTJ sub-devices 200_b1 and 200_b2 are in contact with the conducting layer 272. Furthermore, the pinned layer 230 of the MTJ device 200_a is in contact with the conducting layer 272.

In some embodiments, the thickness of the free layers 210 of the MTJ device 200_a and the MTJ sub-devices 200_b1 and 200_b2 are the same. Furthermore, the thickness of the barrier layer 220 of the MTJ device 200_a and the MTJ sub-devices 200_b1 and 200_b2 are the same, and the thickness of the pinned layer 230 of the MTJ device 200_a and the MTJ sub-devices 200_b1 and 200_b2 are the same. It should be noted that the MTJ device 200_a and the MTJ sub-devices 200_b1 and 200_b2 are the same sizes. Specifically, the area of the free layer 210, the barrier layer 220 and the pinned layer 230 of the MTJ device 200_a and the MTJ sub-devices 200_b1 and 200_b2 have the same unity areas. The MTJ sub-devices 200_b1 and 200_b2 are coupled in parallel to form the MTJ device 200_b, and the MTJ device 200_b has greater area than the MTJ device 200_a. Therefore, the equivalent impedances of the MTJ devices 200_a and 200_b are different. Furthermore, various impedances are provided by coupling multiple unity areas in parallel.

Figure 13:
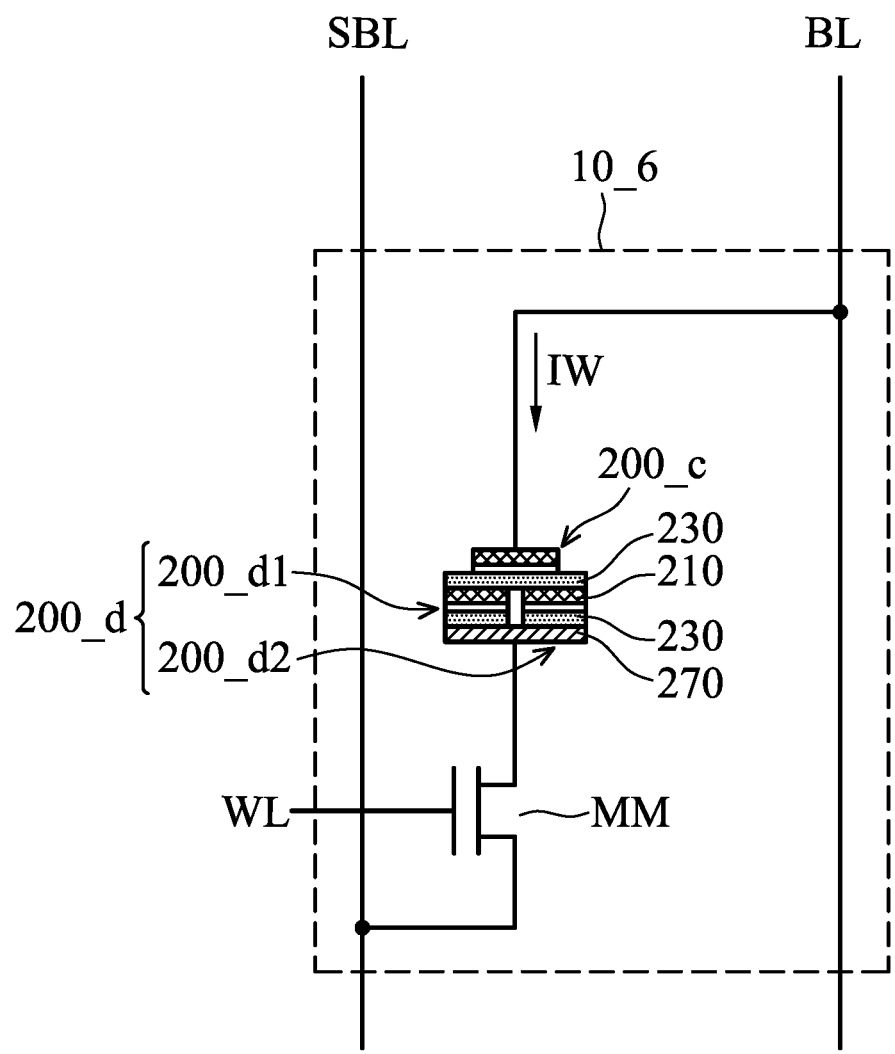
FIG. 13 shows an example schematic of an MRAM cell, in accordance with some embodiments of the disclosure.

FIG. 13 shows an example schematic of an MRAM cell 10_6, in accordance with some embodiments of the disclosure. The MRAM cell 10_6 includes a transistor MM and the MTJ devices 200_c and 200_d coupled in series. The transistor MM is coupled between a source line SBL and the MTJ device 200_d, and a gate of the transistor MM is coupled to a word line WL. The MTJ devices 200_c and 200_d are stacked between the transistor MM and a bit line BL. The MRAM cell 10_6 is capable of storing data based on the stacked MTJ devices 200_c and 200_d. As described above, by applying the access current Iw to the stacked MTJ devices 200_c and 200_d, the MTJ device 200_c and/or 200_d is switched from a parallel magnetic state P_state to an anti-parallel magnetic state AP_state or from the anti-parallel magnetic state AP_state to the parallel magnetic state P_state.

In the MRAM cell 10_6, the MTJ device 200_d is formed by the MTJ sub-devices 200_d1 and 200_d2. The MTJ sub-devices 200_d1 and 200_d2 are coupled in parallel between the conducting layer 270 (e.g., electrode) and the pinned layer 230 of the MTJ device 200_c. The pinned layers 230 of the MTJ sub-devices 200_d1 and 200_d2 are in contact with the conducting layer 270, and the free layers 210 of the MTJ sub-devices 200_d1 and 200_d2 are in contact with the pinned layers 230 of the MTJ devices 200_c.

In some embodiments, the thickness of the free layers 210 of the MTJ device 200_c and the MTJ sub-devices 200_d1 and 200_d2 are the same. Furthermore, the thickness of the barrier layer 220 of the MTJ device 200_c and the MTJ sub-devices 200_d1 and 200_d2 are the same, and the thickness of the pinned layer 230 of the MTJ device 200_c and the MTJ sub-devices 200_d1 and 200_d2 are the same. Furthermore, the area of the free layer 210 and the barrier layer 220 of the MTJ device 200_c and the MTJ sub-devices 200_d1 and 200_d2 are the same. The area of the pinned layer 230 of the MTJ sub-devices 200_d1 and 200_d2 are the same. In FIG. 13, the area of the pinned layer 230 of the MTJ device 200_c is greater than that of the MTJ sub-devices 200_d1 and 200_d2. In some embodiments, the area of the pinned layer 230 of the MTJ device 200_c is equal to that of the conducting layer 270.

As described above, the MTJ sub-devices 200_d1 and 200_d2 are coupled in parallel to form the MTJ device 200_d, and the MTJ device 200_d has greater area than the MTJ device 200_c. Therefore, the equivalent impedances of the MTJ devices 200_c and 200_d are different.

Figure 14:
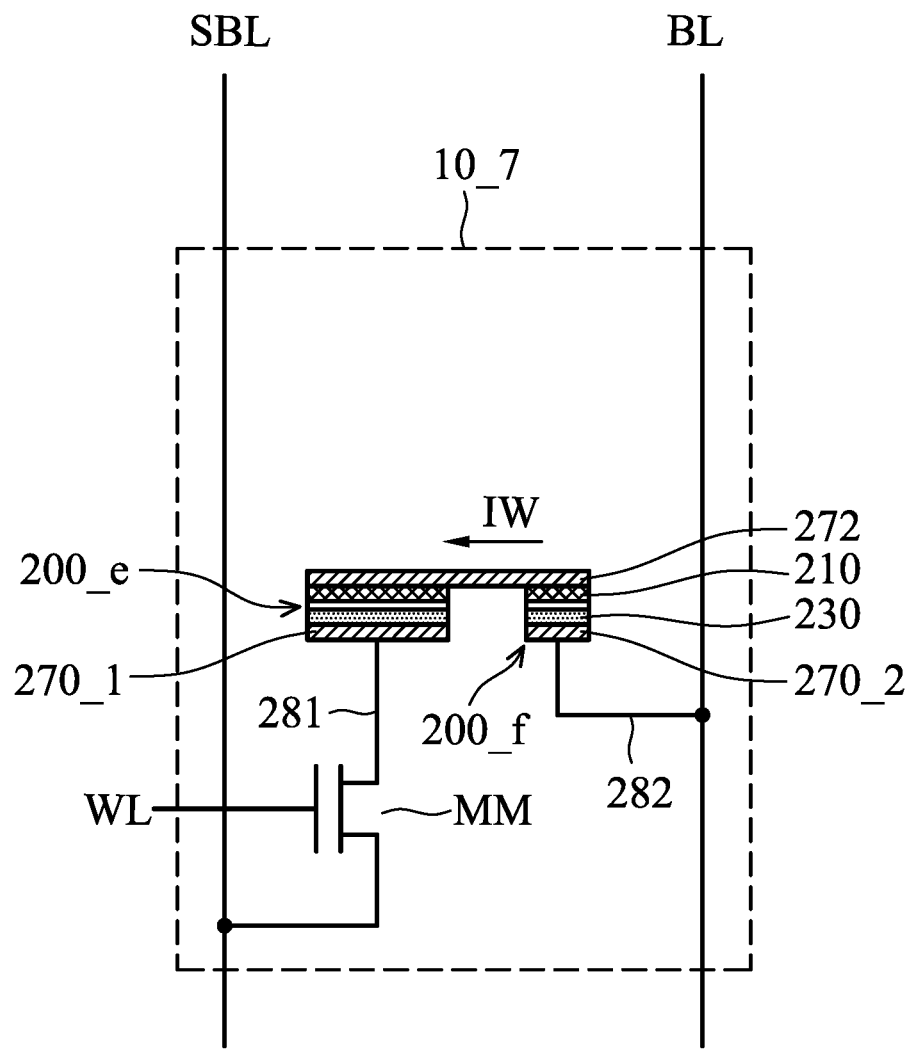
FIG. 14 shows an example schematic of an MRAM cell, in accordance with some embodiments of the disclosure.

FIG. 14 shows an example schematic of an MRAM cell 10_6, in accordance with some embodiments of the disclosure. The MRAM cell 10_6 includes a transistor MM and the MTJ devices 200_e and 200_f coupled in series. The transistor MM is coupled between a source line SBL and the MTJ device 200_e, and a gate of the transistor MM is coupled to a word line WL. The MTJ device 200_e is coupled between the transistor MM and the conducting layer 272, and the MTJ device 200_f is coupled between the conducting layer 272 and the bit line BL. The MRAM cell 10_7 is capable of storing data based on the MTJ devices 200_e and 200_f. As described above, by applying the access current Iw to the MTJ devices 200_e and 200_f, the MTJ device 200_e and/or 200_f is switched from a parallel magnetic state P_state to an anti-parallel magnetic state AP_state or from the anti-parallel magnetic state AP_state to the parallel magnetic state P_state.

In the MRAM cell 10_7, the pinned layers 230 of the MTJ device 200_e is in contact with the conducting layer 270_1, and the free layers 210 of the MTJ device 200_e is in contact with the conducting layer 272. Furthermore, the pinned layers 230 of the MTJ device 200_f is in contact with the conducting layer 270_2, and the free layers 210 of the MTJ device 200_f is in contact with the conducting layer 272. The conducting layers 270_1 and 270_2 are formed in the same level that is different from the conducting layer 272. It should be noted that the MTJ devices 200_e and 200_f are different sizes.

In some embodiments, the thickness of the free layers 210 of the MTJ devices 200_e and 200_f are the same. Furthermore, the thickness of the barrier layer 220 of the MTJ devices 200_e and 200_f are the same, and the thickness of the pinned layer 230 of the MTJ devices 200_e and 200_f are the same. The difference between the MTJ devices 200_e and 200_f is that the area of the free layer 210, the barrier layer 220 and the pinned layer 230 of the MTJ device 200_e is greater than that of the MTJ device 200_f. Thus, the equivalent impedances of the MTJ devices 200_e and 200_f are different.

In some embodiments, the thickness of the free layers 210 of the MTJ devices 200_e and 200_f are the same, and the thickness of the pinned layer 230 of the MTJ devices 200_e and 200_f are the same. Furthermore, the area of the free layer 210, the barrier layer 220 and the pinned layer 230 of the MTJ device 200_e is the same as that of the MTJ device 200_f. The difference between the MTJ devices 200_e and 200_f is that the thickness of the barrier layer 220 of the MTJ devices 200_e and 200_f are different. Thus, the equivalent impedances of the MTJ devices 200_e and 200_f are different.

In some embodiments, the MTJ devices 200_e and 200_f are formed by multiple MTJ sub-devices coupled in parallel or in serial, i.e., the MTJ devices 200_e and 200_f are not single MTJ device. In the MRAM cell 10_7, the MTJ devices 200_e and 200_f are formed in the same level. In some embodiments, multiple MTJ devices are coupled between the MTJ devices 200_e and 200_f, and the MTJ devices and the MTJ devices 200_e and 200_f are formed in the same level. A connecting line 281 coupled between the MTJ device 200_e and the transistor MM is formed below the MTJ device 200_e. Similarly, a connecting line 282 coupled between the MTJ device 200_f and the bit line BL is formed below the MTJ device 200_e. In some embodiments, the connecting lines 281 and 282 are formed in the same metal layer under the MTJ devices 200_e and 200_f. In some embodiments, the connecting lines 281 and 282 are formed in the different metal layers under the MTJ devices 200_e and 200_f. In FIG. 14, no connecting line is present over the MTJ devices 200_e and 200_f, and the routing metal layers over the MTJ devices 200_e and 200_f can be omitted.

Embodiments of MRAM including multiple MTJ devices are provided. In the MRAM cell, the MTJ devices are coupled in series and stacked vertically, and the stacked MTJ devices does not increase the area of the MRAM cell. Furthermore, the MTJ devices are different sizes, and the equivalent impedances of the MTJ devices are different. According to the state transition diagram of the stacked MTJ devices, the access current Iw is used to read the data stored in the MRAM cell or write the data into the MRAM cell 10_1 with one or more write operations. Compared with the conventional MRAM cell including a transistor and a MTJ device, the MRAM cell including the stacked MTJ devices is capable of storing more bits without increasing area.

In some embodiments, a magnetic random access memory (MRAM) cell is provided. The MRAM cell includes a plurality of stacked magnetic tunnel junction (MTJ) devices coupled in serial and coupled between a bit line and a source line. The stacked MTJ devices have different sizes. Each of the stacked MTJ devices includes a free layer, a pinned layer and a barrier layer between the free layer and the pinned layer. The free layers of two adjacent stacked MTJ devices are in direct contact with each other.

In some embodiments, a magnetic random access memory (MRAM) cell is provided. The MRAM cell includes a plurality of stacked magnetic tunnel junction (MTJ) devices coupled in serial and coupled between a bit line and a source line. Each of the stacked MTJ devices includes a free layer, a pinned layer and a barrier layer between the free layer and the pinned layer. A first stacked MTJ device of the stacked MTJ devices is coupled to the source line. The free layers of two adjacent stacked MTJ devices between the first stacked MTJ device and the bit line are in direct contact with each other. Size of the first stacked MTJ device is greater than that of the two adjacent stacked MTJ devices.

In some embodiments, a magnetic random access memory (MRAM) is provided. The MRAM includes a plurality of memory cells arranged in a memory array. Each of the memory cells includes a plurality of magnetic tunnel junction (MTJ) devices coupled in series for storing multiple-bit data and a transistor. In each of the memory cells, one of the MTJ devices is coupled to the transistor, and the MTJ devices have different sizes. In each of the memory cells, each of the MTJ devices includes a free layer, a pinned layer and a barrier layer between the free layer and the pinned layer and the pinned layer of the one of the MTJ devices is directly coupled to the transistor. In each of the memory cells, the free layers of two adjacent MTJ devices are in direct contact with each other.

The foregoing outlines nodes of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A magnetic random access memory (MRAM) cell, comprising:
   a plurality of stacked magnetic tunnel junction (MTJ) devices coupled in serial and coupled between a bit line and a source line;
   wherein the stacked MTJ devices have different sizes,
   wherein each of the stacked MTJ devices comprises a free layer, a pinned layer and a barrier layer between the free layer and the pinned layer,
   wherein the free layers of two adjacent stacked MTJ devices are in direct contact with each other.

2. The MRAM cell as claimed in claim 1, wherein the number of the stacked MTJ devices is N, and a bit number of data stored in the MRAM cell is Log 2(2N).

3. The MRAM cell as claimed in claim 1, wherein thickness of the pinned layers of the stacked MTJ devices are the same, and thickness of the free layers of the stacked MTJ devices are the same.

4. The MRAM cell as claimed in claim 1, wherein the free layers of the two adjacent stacked MTJ devices have different areas.

5. The MRAM cell as claimed in claim 4, wherein thickness of the barrier layers of the two adjacent stacked MTJ devices are the same.

6. The MRAM cell as claimed in claim 1, wherein the free layers of the two adjacent stacked MTJ devices have the same areas.

7. The MRAM cell as claimed in claim 6, wherein thicknesses of the barrier layers of the two adjacent stacked MTJ devices are different.

8. A magnetic random access memory (MRAM) cell, comprising:
   a plurality of stacked magnetic tunnel junction (MTJ) devices coupled in serial and coupled between a bit line and a source line;
   wherein each of the stacked MTJ devices comprises a free layer, a pinned layer and a barrier layer between the free layer and the pinned layer,
   wherein a first stacked MTJ device of the stacked MTJ devices is coupled to the source line,
   wherein the free layers of two adjacent stacked MTJ devices between the first stacked MTJ device and the bit line are in direct contact with each other,
   wherein size of the first stacked MTJ device is greater than that of the two adjacent stacked MTJ devices.

9. The MRAM cell as claimed in claim 8, wherein the number of the stacked MTJ devices is N, and a bit number of data stored in the MRAM cell is Log 2(2N).

10. The MRAM cell as claimed in claim 8, wherein the stacked MTJ devices have different sizes.

11. The MRAM cell as claimed in claim 8, wherein area of the first stacked MTJ device is greater than that of the two adjacent stacked MTJ devices.

12. The MRAM cell as claimed in claim 8, wherein the two adjacent stacked MTJ devices comprises a second stacked MTJ device close to the source line and a third stacked MTJ device away from the source line, wherein area of the second stacked MTJ device is less than that of the third stacked MTJ device.

13. The MRAM cell as claimed in claim 12, wherein area of the third stacked MTJ device is less than that of the first stacked MTJ device.

14. A magnetic random access memory (MRAM), comprising:
   a plurality of memory cells arranged in a memory array, wherein each of the memory cells comprises a plurality of magnetic tunnel junction (MTJ) devices coupled in series for storing multiple-bit data and a transistor, wherein in each of the memory cells, one of the MTJ devices is coupled to the transistor, and the MTJ devices have different sizes, wherein in each of the memory cells, each of the MTJ devices comprises a free layer, a pinned layer and a barrier layer between the free layer and the pinned layer, and the pinned layer of the one of the MTJ devices is directly coupled to the transistor, wherein in each of the memory cells, the free layers of two adjacent MTJ devices are in direct contact with each other.

15. The MRAM as claimed in claim 14, wherein the MTJ devices have different areas in each of the memory cells.

16. The MRAM as claimed in claim 14, wherein in each of the memory cells, the number of the MTJ devices is N, and a bit number of data stored in the MRAM cell is Log 2(2N).

17. The MRAM as claimed in claim 14, wherein in each of the memory cells, the free layers of the two adjacent MTJ devices have different areas.

18. The MRAM as claimed in claim 17, wherein thickness of the barrier layers of the two adjacent MTJ devices are the same.

19. The MRAM as claimed in claim 14, wherein in each of the memory cells, the free layers of the two adjacent MTJ devices have the same areas.

20. The MRAM as claimed in claim 19, wherein thicknesses of the barrier layers of the two adjacent MTJ devices are different.

* * * * *